United States Patent
Jung et al.

(10) Patent No.: US 12,384,963 B2
(45) Date of Patent: Aug. 12, 2025

(54) LIGHT-EMITTING DEVICE, METHOD OF PREPARING THE LIGHT-EMITTING DEVICE, AND METHOD OF OPERATING THE LIGHT-EMITTING DEVICE

(71) Applicants: Samsung Electronics Co., Ltd., Suwon-si (KR); Korea Advanced Institute of Science and Technology, Daejeon (KR)

(72) Inventors: Yongsik Jung, Seoul (KR); Muhyun Baik, Daejeon (KR); Seoungtae Kim, Daejeon (KR); Seungyeol Baek, Daejeon (KR); Jinhoon Jeong, Daejeon (KR); Seungyeon Kwak, Suwon-si (KR); Joonghyuk Kim, Seoul (KR); Hyeonho Choi, Seoul (KR); Kyuyoung Hwang, Anyang-si (KR)

(73) Assignees: SAMSUNG ELECTRONICS CO., LTD., Gyeonggi-Do (KR); KOREA ADVANCED INSTITUTE OF SCIENCE AND TECHNOLOGY, Daejeon (KR)

(*) Notice: Subject to any disclaimer, the term of this patent is extended or adjusted under 35 U.S.C. 154(b) by 820 days.

(21) Appl. No.: 17/696,372

(22) Filed: Mar. 16, 2022

(65) Prior Publication Data
US 2022/0302397 A1    Sep. 22, 2022

(30) Foreign Application Priority Data
Mar. 16, 2021    (KR) ........................ 10-2021-0034247

(51) Int. Cl.
*H01L 51/50*    (2006.01)
*C07F 5/02*    (2006.01)
(Continued)

(52) U.S. Cl.
CPC .............. *C09K 11/06* (2013.01); *C07F 5/025* (2013.01); *C07F 15/0086* (2013.01);
(Continued)

(58) Field of Classification Search
None
See application file for complete search history.

(56) References Cited

U.S. PATENT DOCUMENTS 9,502,671 B2    11/2016    Li et al.
10,295,882 B2    5/2019    Kobayashi et al.
(Continued)

FOREIGN PATENT DOCUMENTS

KR    1020160091650 A    8/2016
KR    20180001482 A    1/2018
(Continued)

OTHER PUBLICATIONS

Lu et al., Butterfly-shaped p-extended benzothiadiazoles as promising emitting materials for white OLEDs; J. Mater. Chem. C, 2019, 7, 6706-6713 (Year: 2019).*
(Continued)

*Primary Examiner* — Gregory D Clark
(74) *Attorney, Agent, or Firm* — CANTOR COLBURN LLP

(57) ABSTRACT

A light-emitting device, including: a carbon-containing film, wherein the carbon-containing film includes at least one carbon atom; and a light-emitting group represented by Formula 1, wherein the light-emitting group is chemically bonded to the at least one carbon atom on a surface of the carbon-containing film:

$$*-(C{\equiv}C)-(A_1)_{m1}-(A_2)_{m2} \quad \text{Formula 1}$$

wherein * indicates a chemical bonding site to the at least one carbon atom on the surface of the carbon-containing film, $A_1$ is a linking group, $A_2$ is a group comprising a
(Continued)

light-emitting moiety, and m1 and m2 are each independently an integer from 1 to 10.

20 Claims, 2 Drawing Sheets

(51) Int. Cl.
| | |
|---|---|
| C07F 15/00 | (2006.01) |
| C09K 11/06 | (2006.01) |
| H10K 85/30 | (2023.01) |
| H10K 50/11 | (2023.01) |
| H10K 71/00 | (2023.01) |
| H10K 77/10 | (2023.01) |
| H10K 101/10 | (2023.01) |
| H10K 102/00 | (2023.01) |

(52) U.S. Cl.
CPC ......... *H10K 85/322* (2023.02); *H10K 85/346* (2023.02); *C09K 2211/1018* (2013.01); *C09K 2211/1029* (2013.01); *C09K 2211/185* (2013.01); *H10K 50/11* (2023.02); *H10K 71/00* (2023.02); *H10K 77/111* (2023.02); *H10K 2101/10* (2023.02); *H10K 2102/311* (2023.02)

(56) References Cited

U.S. PATENT DOCUMENTS

| | | |
|---|---|---|
| 10,381,506 B1 | 8/2019 | Torres, Jr. et al. |
| 2004/0191567 A1 | 9/2004 | Caballero |
| 2018/0315938 A1 | 11/2018 | Kim et al. |
| 2022/0293880 A1 | 9/2022 | Hwang et al. |

FOREIGN PATENT DOCUMENTS

| | | |
|---|---|---|
| WO | 2019015658 A1 | 1/2019 |
| WO | 2019144845 A1 | 8/2019 |

OTHER PUBLICATIONS

Aleshin, Andrey N., et al., "Hybrid active layers from a conjugated polymer and inorganic nanoparticles for organic light emitting devices with emission colour tuned by electric field," Journal of Physics D: Applied Physics, 42, 2009 105108, 8 pp.

Guo, Song, et al., "Luminescent ion pairs with tunable emission colors for light-emitting devices and electrochromic switches," Chemical Science, vol. 8, 2017, pp. 348-360.

Ma, Yun et al., "Phosphorescent ionic iridium (III) complexes displaying counterion-dependent emission colors for flexible electrochromic luminescence device," Advanced Optical Materials, 2017, vol. 5, 7 pp.

Mo, Xiaoming, et al., "Unusual electroluminescence from n-ZnO@i-MgO core shell nanowire color-tunable light-emitting diode at reverse bias," Physical Chemistry Chemical Physics, 2014, vol. 16, pp. 9302-9308.

Office Action issued Feb. 18, 2025 of KR Patent Application No. 10-2021-0034247.

* cited by examiner

LIGHT-EMITTING DEVICE, METHOD OF PREPARING THE LIGHT-EMITTING DEVICE, AND METHOD OF OPERATING THE LIGHT-EMITTING DEVICE

CROSS-REFERENCE TO RELATED APPLICATION

This application is based on and claims priority to Korean Patent Application No. 10-2021-0034247, filed on Mar. 16, 2021, in the Korean Intellectual Property Office, and all benefits accruing therefrom under 35 U.S.C. § 119, the entire content of which is incorporated by reference herein.

BACKGROUND

1. Field

The present disclosure relates to light-emitting devices, methods of preparing the light-emitting devices, and operating methods of the light-emitting devices.

2. Description of the Related Art

Light-emitting devices that can be used in devices such as various displays and light sources has been an active area of recent research and development. From among these devices, organic light-emitting devices (OLEDs) are self-emissive devices, and have excellent characteristics in terms of viewing angles, response time, luminance, driving voltage, and response speed, and OLEDs can also produce full-color images.

In an example, an organic light-emitting device includes an anode, a cathode, and an organic layer located between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons may then recombine in the emission layer to produce excitons. These excitons may then transition from an excited state back to a ground state, thus generating light.

There remains a continuing need to develop, other than these organic light-emitting types of devices, a next-generation of light-emitting devices having a structure and a light-emitting mechanism that are different from those of the current and previous generations of OLEDs.

SUMMARY

Provided are light-emitting devices, methods of preparing the light-emitting devices, and operating methods of light-emitting devices.

Additional aspects will be set forth in part in the description which follows and, in part, will be apparent from the description, or may be learned by practice of the presented embodiments of the disclosure.

According to an aspect, a light-emitting device includes:
a carbon-containing film, wherein the carbon-containing film includes at least one carbon atom; and
a light-emitting group represented by Formula 1,
wherein the light-emitting group is chemically bonded to the at least one carbon atom on a surface of the carbon-containing film:

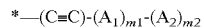  Formula 1 wherein, in Formula 1,
* indicates a chemical bonding site to the at least one carbon atom on the surface of the carbon-containing film,
$A_1$ is a linking group,
$A_2$ is a light-emitting moiety, and
m1 and m2 are each independently an integer from 1 to 10, wherein, when m1 is 2 or more, two or more $A_1$ are identical to or different from each other, and when m2 is 2 or more, two or more $A_2$ are identical to each other or different from each other.

According to another aspect, provided is a method of manufacturing a light-emitting device, the method including:
providing a carbon-containing film, wherein the carbon-containing film comprises at least one carbon atom; and
contacting the carbon-containing film with a compound represented by Formula 1A and chemically bonding a light-emitting group represented by Formula 1 to the at least one carbon atom on a surface of the carbon-containing film:

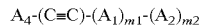  Formula 1A

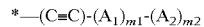  Formula 1 wherein, in Formulae 1A and 1,
$A_4$ is an organic moiety,
* indicates a chemical bonding site to the at least one carbon atom on the surface of the carbon-containing film,
$A_1$ is a linking group,
$A_2$ is a group comprising a light-emitting moiety, and
m1 and m2 are each independently an integer from 1 to 10, wherein, when m1 is 2 or greater, two or more $A_1$ are identical to or different from each other, and when m2 is 2 or greater, two or more $A_2$ are identical to each other or different from each other.

According to still another aspect, an method of operating a light-emitting device includes controlling a voltage applied to a carbon-containing film of the light-emitting device.

BRIEF DESCRIPTION OF THE DRAWINGS

The above and other aspects, features, and advantages of certain exemplary embodiments of the disclosure will be more apparent from the following detailed description taken in conjunction with the accompanying drawings, wherein.

DETAILED DESCRIPTION

Figure 1:
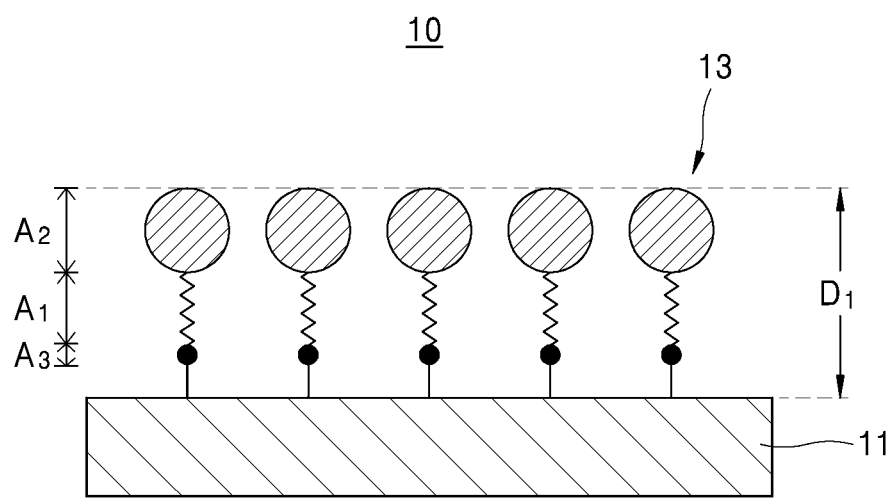
FIG. 1 is a schematic cross-sectional view showing a light-emitting device according to one or more embodiments.

Reference will now be made in further detail to exemplary embodiments, examples of which are illustrated in the accompanying drawings, wherein like reference numerals refer to like elements throughout. In this regard, the present exemplary embodiments may have different forms and should not be construed as being limited to the detailed descriptions set forth herein. Accordingly, the one or more exemplary embodiments are merely described in further detail below, and by referring to the figures, to explain certain aspects and/or features.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." As used herein, the term "and/or" includes any and all combinations of one or more of the associated listed items. Expressions such as "at least one of," when preceding a list of elements, modify the entire list of elements and do not modify the individual elements of the list. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Hereinafter, a work function or a highest occupied molecular orbital (HOMO) energy level is expressed as an absolute value from a vacuum level. In addition, when the work function or the HOMO energy level is referred to be "deep," "high" or "large," the work function or the HOMO energy level has a large absolute value based on "0 electron volts (eV)" of the vacuum level, while when the work function or the HOMO energy level is referred to be "shallow," "low," or "small," the work function or HOMO energy level has a small absolute value based on "0 eV" of the vacuum level.

Description of FIG. 1

A light-emitting device 10 of FIG. 1 includes a carbon-containing film 11 and a light-emitting group 13.

The carbon-containing film 11 includes at least one carbon atom. In one or more embodiments, the carbon-containing film is a carbon-containing material, wherein the carbon-containing material includes at least one carbon atom.

As used herein, the term "film" refers to a layer. Therefore, the carbon-containing film may alternatively be referred to as "the carbon-containing layer."

In one or more embodiments, the carbon-containing film 11 may not include metal.

In one or more embodiments, the carbon-containing film 11 may be a conductive carbon-containing film.

In one or more embodiments, the carbon-containing film 11 may be a flexible film. When the carbon-containing film 11 is a flexible film, the light-emitting device 10 may be a flexible light-emitting device.

In one or more embodiments, the carbon-containing film 11 may be a porous film. In one or more embodiments, the carbon-containing material included in the carbon-containing film 11 may be a porous carbon-containing material including: micropores having a pore diameter (i.e., a d50 particle size) of less than about 2 nanometers (nm); mesopores having a pore diameter in the range of about 2 nm to about 50 nm; macropores having a pore diameter greater than about 50 nm; or a combination thereof.

In one or more embodiments, the carbon-containing material included in the carbon-containing film 11 may be present in the shape of a tube, a rod, a fiber, a sheet, a wire, or a particle. In one or more embodiments, carbon-containing material included in the carbon-containing film 11 may be present as one or more of a tube, a rod, a fiber, a sheet, a wire, a particle, or as a combination of the foregoing shapes.

In one or more embodiments, the carbon-containing film 11 may include a carbon-containing material, and the carbon-containing material may includes a carbon nanotube, a carbon nanorod, a carbon fiber, a graphene sheet, a carbon nanowire, a carbon-containing particle (for example, graphene particles, active carbon particles, porous carbon particles, or the like), a graphite, a glassy carbon, a fullerene, a carbon paste, or a combination thereof.

In one or more embodiments, the carbon-containing film 11 may further include heteroatoms other than carbon, in addition to the at least one carbon. In one or more embodiments, the carbon-containing film 11 may further include nitrogen (N), oxygen (O), silicon (Si), boron (B), or a combination thereof, in addition to the at least one carbon (C). The heteroatom may be an atom derived from a material added to the carbon-containing film 11 to improve conductivity, rigidity, flexibility, durability, or the like of the carbon-containing film 11. In one or more embodiments, the heteroatom may be an atom derived from a material remaining in the carbon-containing film 11 when the carbon-containing film 11 is manufactured.

The thickness of the carbon-containing film 11 may be in the range of about 2 nm to about 500 nm.

The carbon-containing film 11 may be manufactured using any suitable manufacturing method.

In one or more embodiments, the carbon-containing film 11 may be manufactured by providing (e.g., by applying) a first mixture including a carbon-containing material as described herein to a substrate, and then heat treating the same. The first mixture may further include a binder, a solvent, and the like. The providing the first mixture to the substrate may be performed by using, for example, a spin coating method, a dipping method, a laser coating method, or the like.

In one or more embodiments, the carbon-containing film 11 may be manufactured in such a manner that a first film including a first precursor of the carbon-containing material as described herein is heat treated (thermally treated) to convert the first precursor included in the first film into a carbon-containing material as described herein. The carbon-containing material included in the carbon-containing film 11 according to the present embodiment may have, for example, a sheet form, but is not limited thereto.

The light-emitting group 13 is chemically bonded to at least one carbon atom on the surface of the carbon-containing film 11. The corresponding structure is clearly distinguished from a structure wherein the luminescent compound molecules are randomly and/or physically stacked on an electrode through a deposition method (for example, a vacuum deposition method, or the like) and/or a coating method (for example, spin coating method, laser printing method, or the like).

A monolayer including a plurality of light-emitting groups 13 may be located on a surface of the carbon-containing film 11, and the monolayer including the plurality of light-emitting groups 13 may be in direct contact with the surface of the carbon-containing film 11. This structure could be identified from the feature wherein the light-emitting group 13 is represented by Formula 1 below and * in Formula 1 indicates a chemical bonding site to the at least one carbon atom on the surface of the carbon-containing film 11.

The thickness ($D_1$) of the monolayer including the plurality of light-emitting groups 13 may vary depending on the length of the light-emitting groups 13. In one or more embodiments, the length of the light-emitting group 13 may be from about 0.1 nm to about 5.0 nm, or from about 0.5 nm to about 2.0 nm.

In addition to the light-emitting group 13, the monolayer including the plurality of light-emitting groups 13 may further include any suitable group that is different from the light-emitting group 13. For example, the monolayer including the plurality of light-emitting groups 13 may include a $A_2$-free group that is a group represented by Formula 1. From among groups represented by Formula 1, the $A_2$-free group may be formed when the chemical bond between $A_1$ and $A_2$ is broken, or when $A_1$ and $A_2$ are not chemically bonded to each other, in forming the monolayer including the plurality of light-emitting groups 13.

The monolayer including the plurality of light-emitting groups 13 may be a self-assembled monolayer. Accordingly, a self-assembled monolayer including the plurality of light-emitting groups 13 may be located in direct contact with an upper or top portion of the carbon-containing film 11.

The light-emitting group 13 is represented by Formula 1:

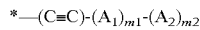  Formula 1

* in Formula 1 indicates the chemical bonding site to the at least one carbon atom on a surface of the carbon-containing film 11.

The group represented by *—C≡C—*' (ethynylene group) in Formula 1 is a group that fixes or attaches the light-emitting group 13 to the surface of the carbon-containing film 11. $A_3$ of FIG. 1 indicates the group represented by *—C≡C—*' (ethynylene group) in Formula 1.

$A_1$ of Formula 1 is a linking group, and may be a linking group represented by *—C≡C*' in Formula 1 to $A_2$, and provide rigidity to the light-emitting group 13. For example, since $A_1$ transfers charges to $A_2$, which is a light-emitting moiety, when voltage is applied to the carbon-containing film 11, $A_1$ may be a group that provides or forms a conjugated pi-electron system with $A_2$.

For example, $A_1$ of Formula 1 may be a single bond, a substituted or unsubstituted $C_2$-$C_{60}$ alkylene group, a substituted or unsubstituted $C_2$-$C_{60}$ alkenylene group, a substituted or unsubstituted $C_2$-$C_{60}$ alkynylene group, a substituted or unsubstituted $C_5$-$C_{30}$ carbocyclic group or a substituted or unsubstituted $C_2$-$C_{30}$ heterocyclic group.

In one or more embodiments, $A_1$ of Formula 1 may be a single bond, a $C_2$-$C_{60}$ alkenylene group that is unsubstituted or substituted with at least one $R_{10a}$, a $C_2$-$C_{60}$ alkynylene group that is unsubstituted or substituted with at least one $R_{10a}$, a $C_5$-$C_{30}$ carbocyclic group that is unsubstituted or substituted with at least one $R_{10a}$, or a $C_2$-$C_{30}$ heterocyclic group that is unsubstituted or substituted with at least one $R_{10a}$.

$R_{10a}$ is as described in connection with $R_{10}$.

In one or more embodiments, $A_1$ of Formula 1 may be:
a single bond; or
$C_2$-$C_{20}$ alkenylene group, a $C_2$-$C_{20}$ alkynylene group, a cyclopentane group, a cyclohexane group, a cycloheptane group, a cyclopentene group, a cyclohexene group, a cycloheptene group, an adamantane group, a norbornane group, a norbornene group, a bicyclo[1.1.1]pentane group, a bicyclo[2.1.1]hexane group, a bicyclo[2.2.2]octane group, a benzene group, a naphthalene group, an anthracene group, a phenanthrene group, a triphenylene group, a pyrene group, a chrysene group, a 1,2,3,4-tetrahydronaphthalene group, a pyrrole group, a borole group, a phosphole group, a cyclopentadiene group, a silole group, a germole group, a thiophene group, a selenophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a benzoquinoline group, a benzoisoquinoline group, a quinoxaline group, a quinazoline group, a phenanthroline group, a pyrazole group, an imidazole group, a triazole group, an azaborole group, an azaphosphole group, an azacyclopentadiene group, an azasilole group, an azagermole group, an azaselenophene group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group (ora bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1] hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1] hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereto.

$A_2$ in Formula 1 is a group comprising a light-emitting moiety, and may be, for example, a luminescent moiety, or a monovalent group derived from a phosphorescent luminescent compound, a fluorescent luminescent compound, or a quantum dot.

$A_2$ in Formula 1 may include a luminescent moiety having a chemical structure in which a highest occupied molecular orbital (HOMO) chromophore is relatively clearly separated from a lowest unoccupied molecular orbital (LUMO) chromophore in the molecule so that the amount of the maximum emission wavelength change of light emitted from light-emitting group 13 can be induced to a maximum value when voltage is applied to the carbon-containing film 11.

The phosphorescent luminescent compound, the fluorescent luminescent compound, and/or the quantum dot may be any suitable phosphorescent luminescent compounds, fluorescent luminescent compounds, or quantum dots, respectively, that are located or arranged between a pair of electrodes of a light-emitting device, for example, of an organic light-emitting device.

The term "a monovalent group derived from material X" used herein refers to a group in which a site of material X from which an arbitrary atom (for example, hydrogen, etc.) is removed, and becomes a chemical bonding site to a neighboring atom. For example, a monovalent group derived from methane ($C_1$-$C_4$) refers to a methyl group (*—$CH_3$ wherein * indicates a chemical bonding site to a neighboring atom).

In one or more embodiments, $A_2$ in Formula 1 may not be a substituted phenyl group.

In one or more embodiments, in Formula 1, $A_2$ may not be a monovalent group derived from a compound including a porphyrin.

In one or more embodiments, $A_2$ of Formula 1 may be a monovalent group derived from an organometallic compound capable of emitting phosphorescent light.

In one or more embodiments, the organometallic compound may include a transition metal. Thus, $A_2$ in Formula 1 may be a monovalent group derived from a transition metal-containing organometallic compound.

In one or more embodiments, the organometallic compound may include one or more of iridium (Ir), platinum (Pt), osmium (Os), rhodium (Rh), ruthenium (Ru), rhenium (Re), palladium (Pd), or gold (Au). Accordingly, $A_2$ of Formula 1 may be a monovalent group derived from an organometallic compound including iridium (Ir), platinum (Pt), osmium (Os), rhodium (Rh), ruthenium (Ru), rhenium (Re), palladium (Pd), or gold (Au).

The organometallic compound may further include at least one ligand bonded to the transition metal in addition to the transition metal as described above. The at least one ligand may be a ligand represented by one of Formulae 2-1 to 2-4:

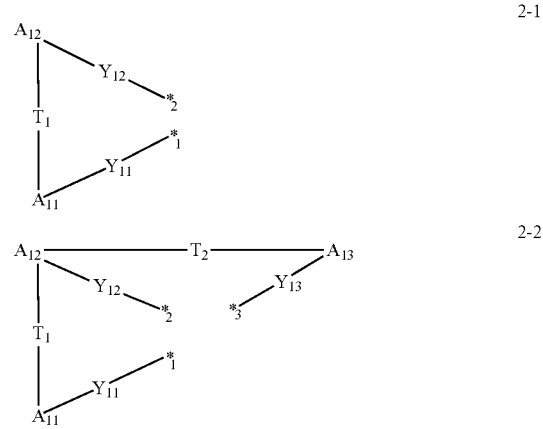

-continued

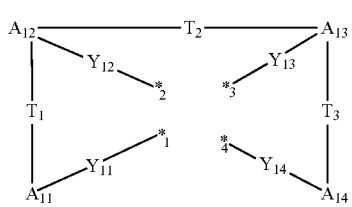

2-3

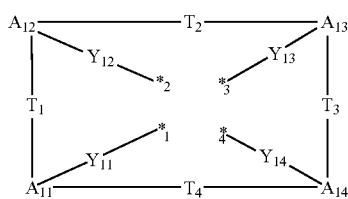

2-4 wherein, in Formulae 2-1 to 2-4,
$A_{11}$ to $A_{14}$ may each independently be a $C_5$-$C_{30}$ carbocyclic group that is unsubstituted or substituted with at least one $R_{10}$, a $C_1$-$C_{30}$ heterocyclic group that is unsubstituted or substituted with at least one $R_{10}$, or a non-cyclic group that is unsubstituted or substituted with at least one $R_{10}$,
$Y_{11}$ to $Y_{14}$ may each independently be a chemical bond (for example, a covalent bond, a coordinate bond, or the like), O, S, $N(R_{91})$, $B(R_{91})$, $P(R_{91})$, or $C(R_{91})(R_{92})$,
$T_1$ to $T_4$ may each independently be a single bond, a double bond, *—$N(R_{93})$—*', *—$B(R_{93})$—*', *—$P(R_{93})$—*', *—$C(R_{93})(R_{94})$—*', *—$Si(R_{93})(R_{94})$—*', *—$Ge(R_{93})(R_{94})$—*', *—S—*', *—Se—*', *—O—*', *—C(=O)—*', *—S(=O)—*', *—S(=O)$_2$—*', *—$C(R_{93})$=*', *=$C(R_{93})$—*', *—$C(R_{93})$=$C(R_{94})$—*', *—C(=S)—*', or *—C≡C—*',
$R_{10}$ and $R_{91}$ to $R_{94}$ may each independently be hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —P(=O)$(Q_8)(Q_9)$, or —$P(Q_8)(Q_9)$,

*1, *2, *3, and *4 each indicates a binding site to a transition metal of the organometallic compound, and
at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be:
deuterium, —F, —Cl, —Br, —I, —SF$_5$, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group,
a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —SF$_5$, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(C)_{13})(Q_{14})(Q_{15})$, —$Ge(Q_{13})(Q_{14})(Q_{15})$, —$B(Q_{16})(Q_{17})$, —P(=O)$(Q_{18})(Q_{19})$, —$P(Q_{18})(Q_{19})$, or a combination thereof;
a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, —SF$_5$, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof;

—$N(Q_{31})(Q_{32})$, —$Ge(Q_{33})(Q_{34})(Q_{35})$, —$B(Q_{36})(Q_{37})$, —$P(=O)(Q_{35})(Q_{39})$, or —$P(Q_{38})(Q_{39})$, or a combination thereof, wherein $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

In one or more embodiments, $A_{11}$ to $A_{14}$ in Formulae 2-1 to 2-4 may each independently be:

a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group, each unsubstituted or substituted with at least one $R_{10}$; or a carbonyl group.

In one or more embodiments, $Y_{11}$ to $Y_{14}$ in Formulae 2-1 to 2-4 may each independently be a chemical bond (for example, a covalent bond, a coordinate bond, or the like), O, or S.

In one or more embodiments, $T_1$ to $T_4$ in Formulae 2-1 to 2-4 may each independently be a single bond, *—$N(R_{93})$—*', *—$B(R_{93})$—*', *—$P(R_{93})$—*', *—$C(R_{93})(R_{94})$—*', *—$Si(R_{93})(R_{94})$—*', *—$Ge(R_{93})(R_{94})$—*', *—S—*', *—Se—*', or *—O—*'.

In one or more embodiments, $R_{10}$ and $R_{91}$ to $R_{94}$ in Formula 2-1 to 2-4 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{20}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a (C$_1$-C$_{20}$ alkyl)bicyclo[2.1.1]hexyl group, a (C$_1$-C$_{20}$ alkyl)bicyclo[2.2.2]octyl group, a phenyl group, a (C$_1$-C$_{20}$ alkyl)phenyl group, a biphenyl group, a terphenyl group, a naphthyl group, a 1,2,3,4-tetrahydronaphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a (C$_1$-C$_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group or an azadibenzothiophenyl group, each unsubstituted or substituted with deuterium, —F, —Cl, —Br, —I, —SF$_5$, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or salt thereof, a C$_1$-C$_{20}$ alkyl group, a deuterium-containing C$_1$-C$_{20}$ alkyl group, a C$_1$-C$_{20}$ alkoxy group, a C$_1$-C$_{20}$ alkylthio group, a cyclopentyl group a cyclohexyl group, a cycloheptyl group, a cyclooctyl group, an adamantanyl group, a norbonanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octylo group, a (C$_1$-C$_{20}$ alkyl)cyclopentyl group, a (C$_1$-C$_{20}$ alkyl)cyclohexyl group, a (C$_1$-C$_{20}$ alkyl)cycloheptyl group, a (C$_1$-C$_{20}$ alkyl)cyclooctyl group, a (C$_1$-C$_{20}$ alkyl)adamantanyl group, a (C$_1$-C$_{20}$ alkyl)norbornanyl group, a (C$_1$-C$_{20}$ alkyl)norbornenyl group, a (C$_1$-C$_{20}$ alkyl)cyclopentenyl group, a (C$_1$-C$_{20}$ alkyl)cyclohexenyl group, a (C$_1$-C$_{20}$ alkyl)cycloheptenyl group, a (C$_1$-C$_{20}$ alkyl)bicyclo[1.1.1]pentyl group, a (C$_1$-C$_{20}$ alkyl)bicyclo[2.1.1]hexyl group, a (C$_1$-C$_{20}$ alkyl)bicyclo[2.2.2]octyl group, a phenyl group, a (C$_1$-C$_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrroyl group, a thiophenyl group, a furanyl group, an imidazolyl group, a pyrazoly group, a thiazolyl group, an isothiazoly group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazoylyl group, an azadibenzofuranyl group, an azadibenzothiophenyl group, or a combination thereof; or —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$), wherein Q$_1$ to Q$_9$ may each independently be:

—CH$_3$, —CD$_3$, —CD$_2$H, —CDH$_2$, —CH$_2$CH$_3$, —CH$_2$CD$_3$, —CHCD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, or —CD$_2$CDH$_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a C$_1$-C$_{20}$ alkyl group, a phenyl group, or a combination thereof.

The organometallic compound may include, in addition to the ligands represented by Formulae 2-1 to 2-4, a ligand, for example, —F, —Cl, —I, —Br, —SF$_5$, or acetylacetonate.

In one or more embodiments, the organometallic compound may be represented by Formula 2(1):

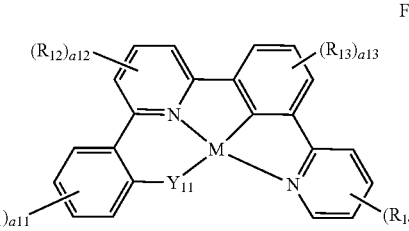

Formula 2(1)

wherein, in Formula 2(1),

M is a transition metal as described herein,

Y$_{11}$ is as described herein,

R$_{11}$ to R$_{14}$ are each as described in connection with R$_{10}$, a11 and a14 may each independently be an integer from 0 to 4, and a12 and a13 may each independently be an integer from 0 to 3.

For example, Y$_{11}$ in Formula 2(1) may be O or S.

In one or more embodiments, A$_2$ of Formula 1 may be a monovalent group derived from one of Compounds PD1 to PD86:

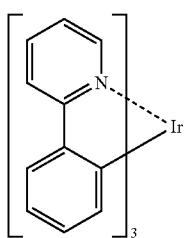
PD1
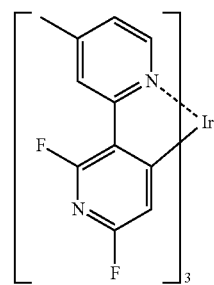
PD6
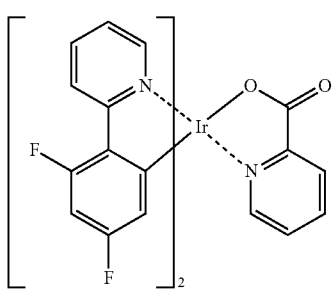
PD2
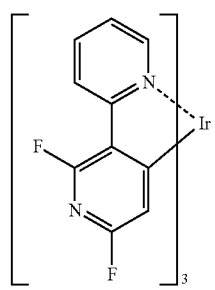
PD7
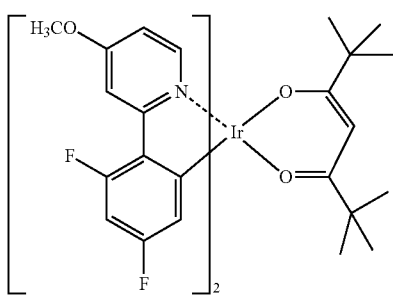
PD3
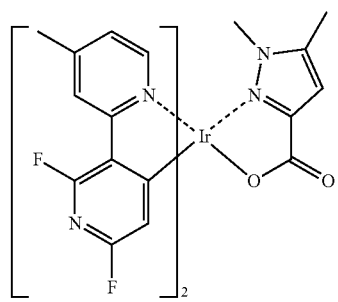
PD8
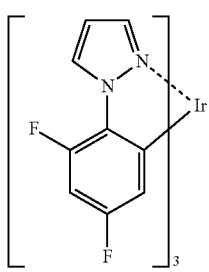
PD4
PD9
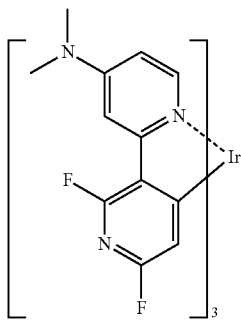
PD5
PD10

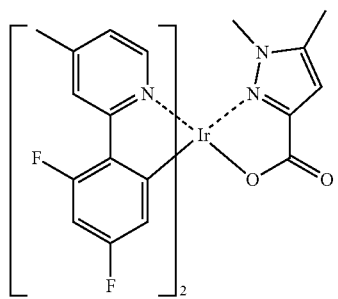
PD11
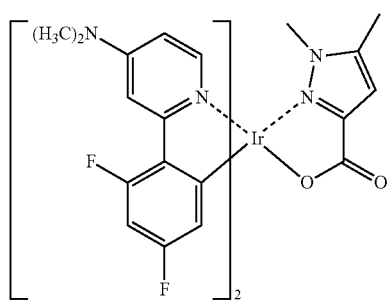
PD12
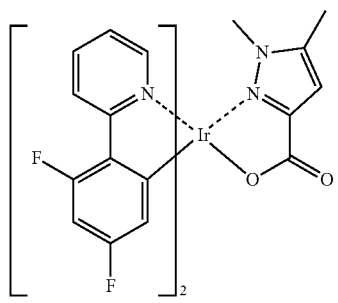
PD13
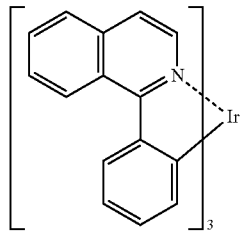
PD14
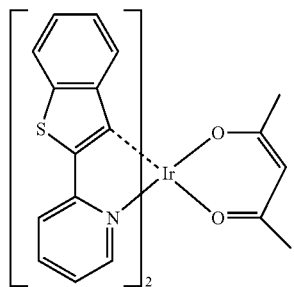
PD15
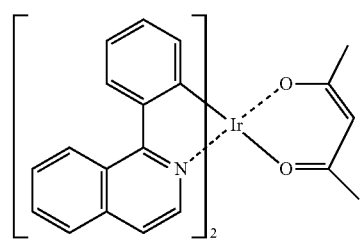
PD16
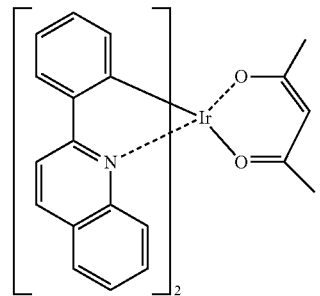
PD17
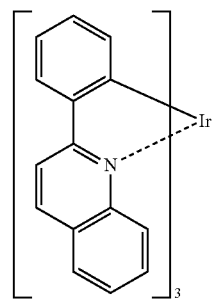
PD18
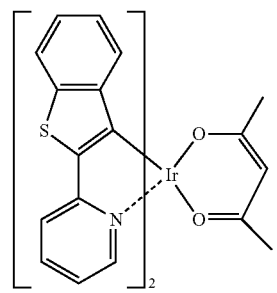
PD19
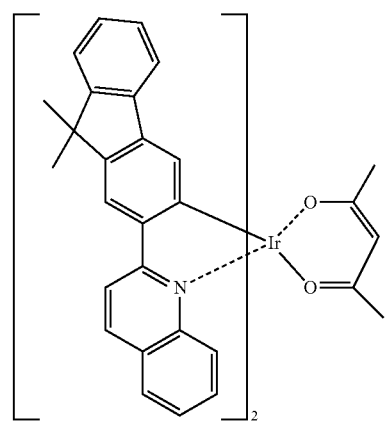
PD20

PD21
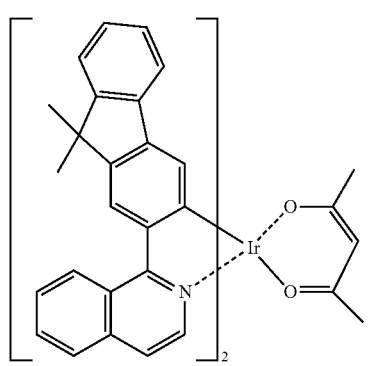
PD22
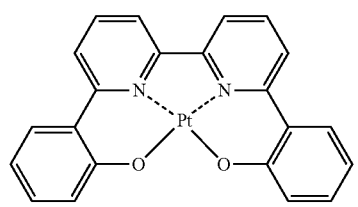
PD23
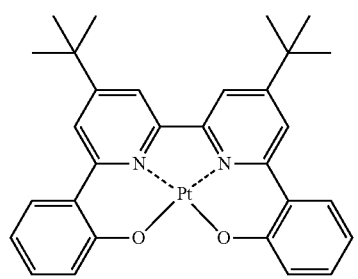
PD24
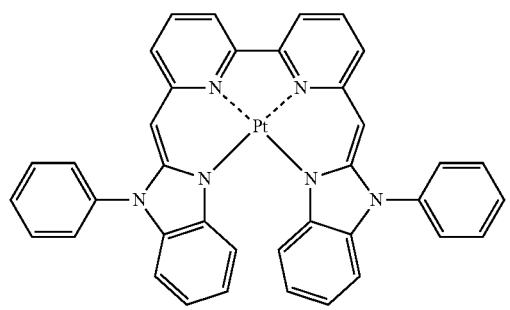
PD25
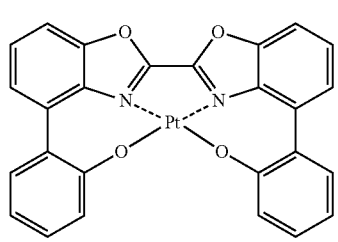
PD26
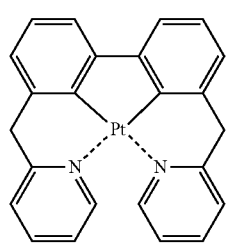
PD27
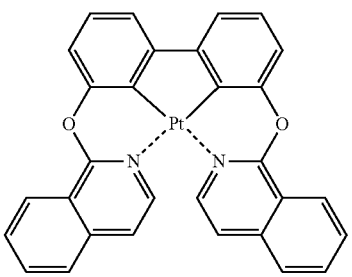
PD28
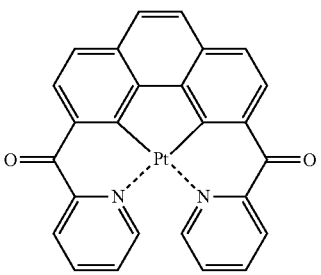
PD29
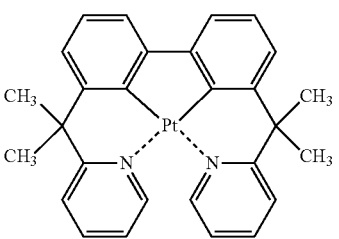
PD30
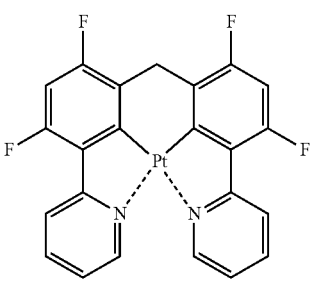
PD31
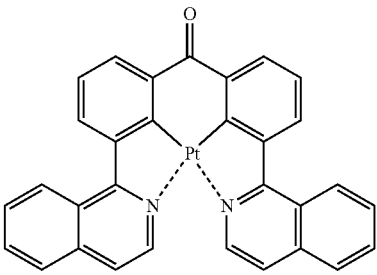
PD32
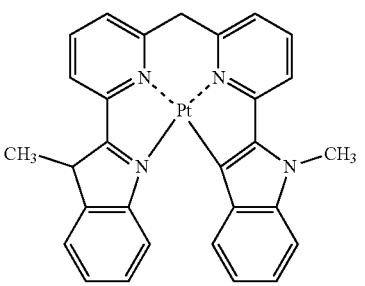

PD33
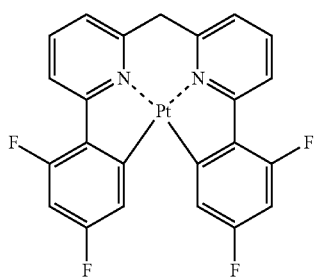
PD34
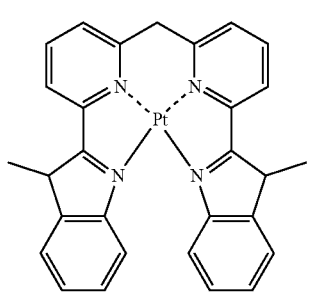
PD35
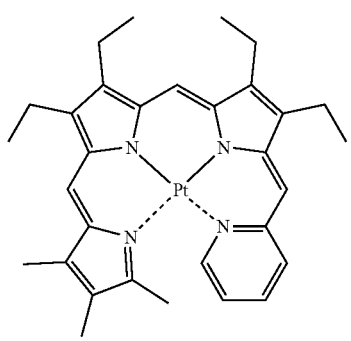
PD36
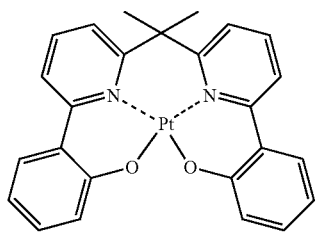
PD37
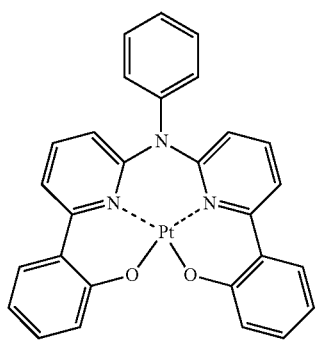
PD38
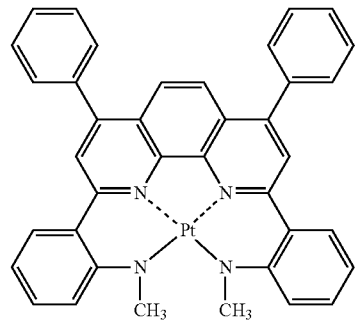
PD39
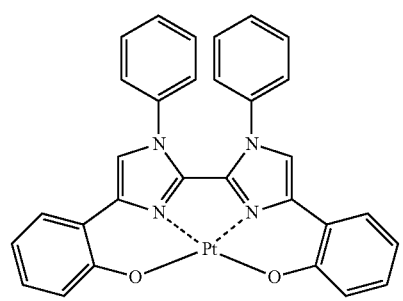
PD40
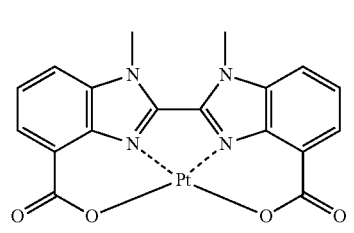
PD41
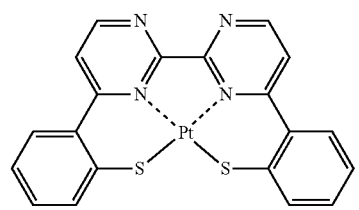
PD42
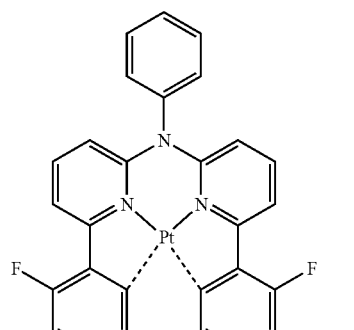

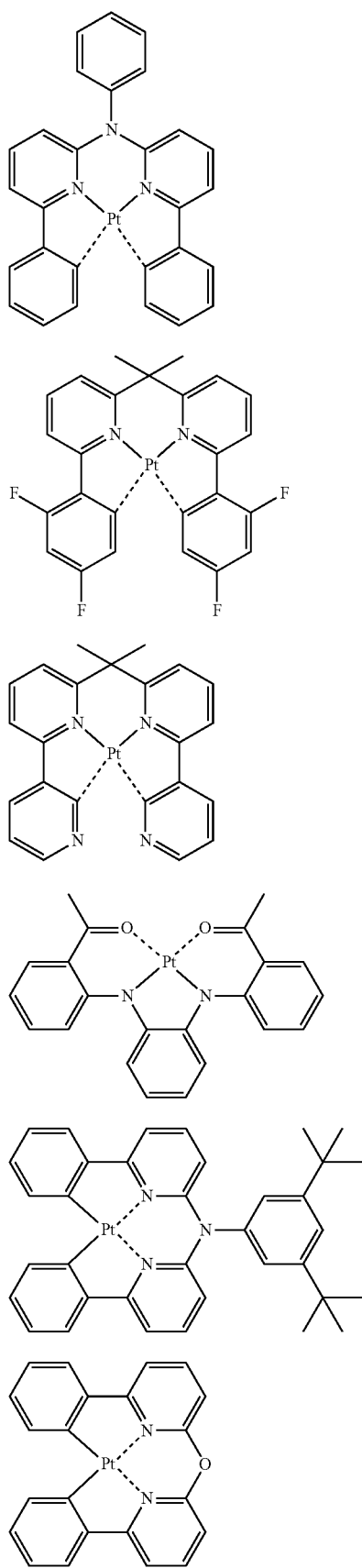
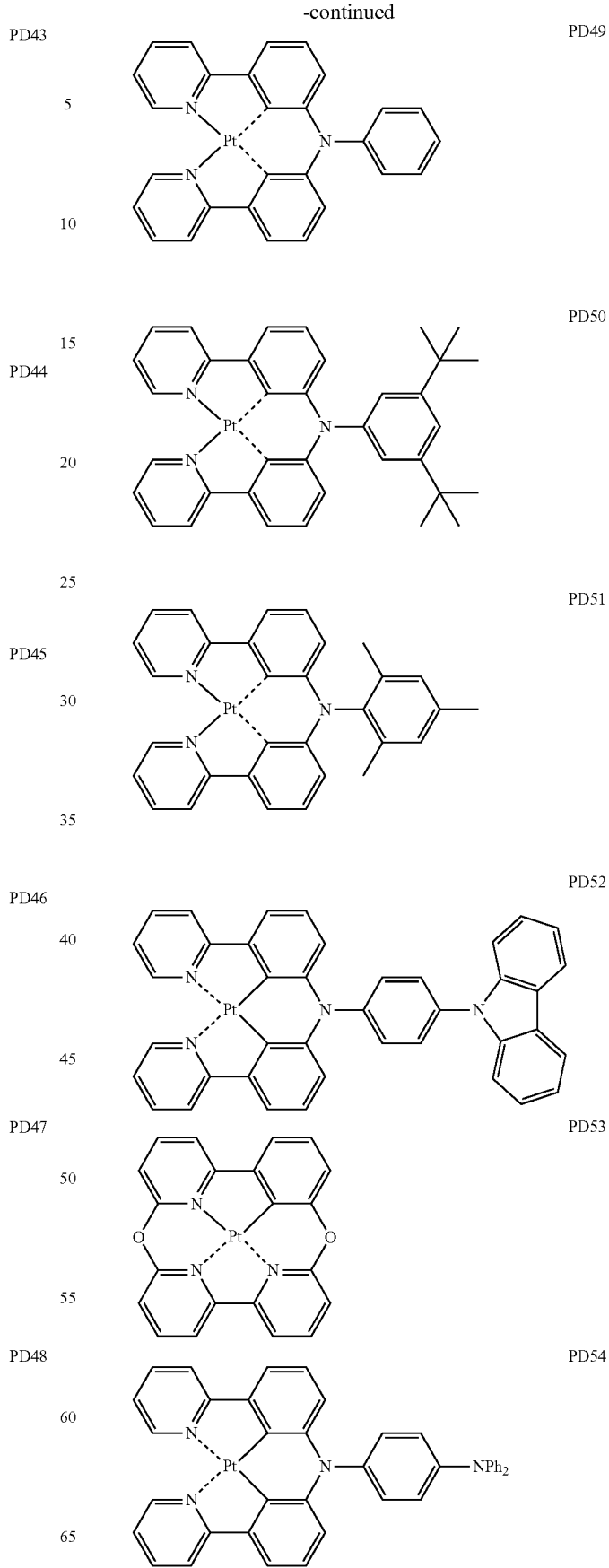

-continued
PD55
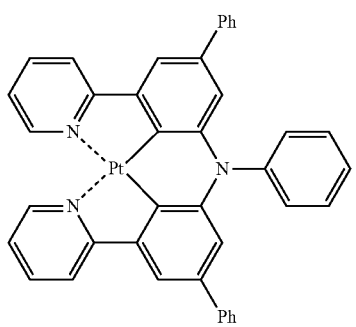
PD56
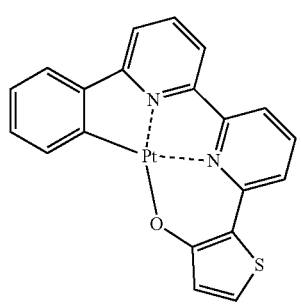
PD57
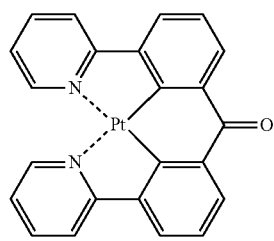
PD58
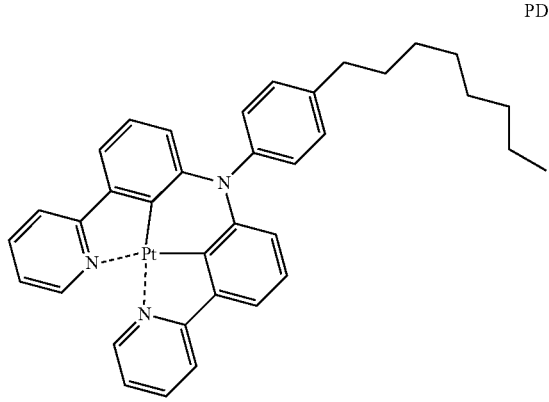
PD59
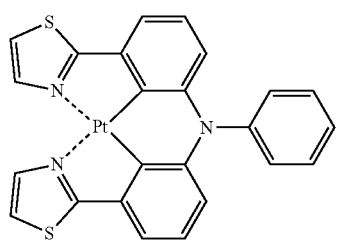
-continued
PD60
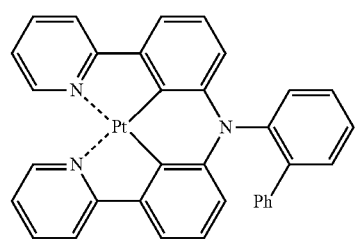
PD61
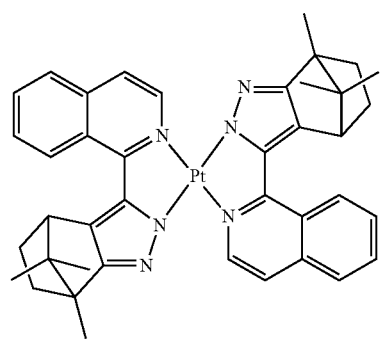
PD62
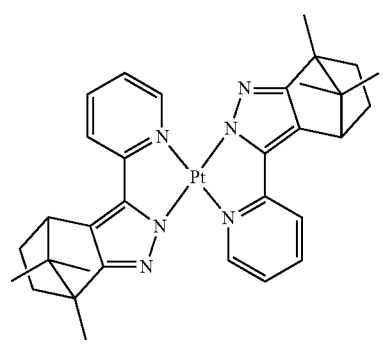
PD63
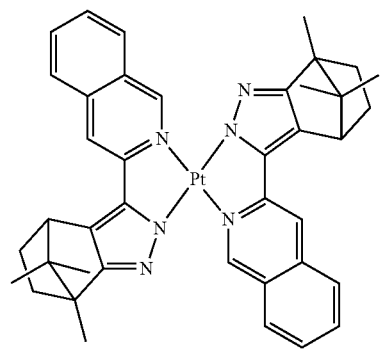
PD64
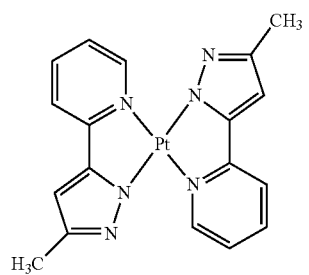

PD65 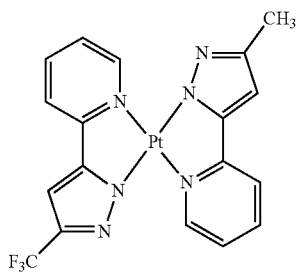
PD66 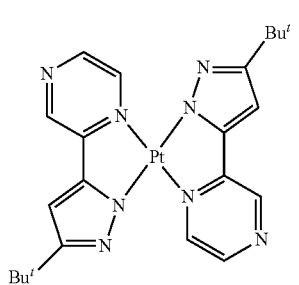
PD67 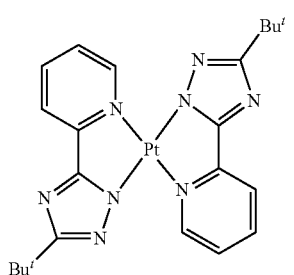
PD68 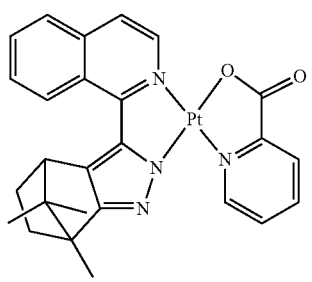
PD69 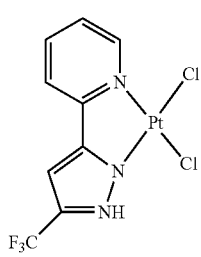
PD70 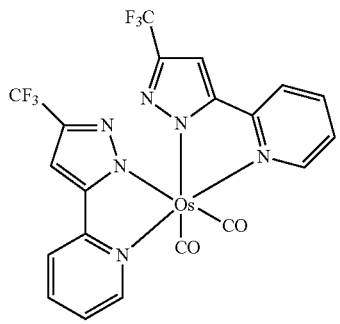
PD71 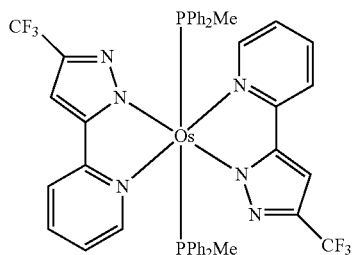
PD72 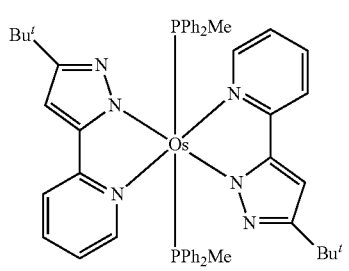
PD73 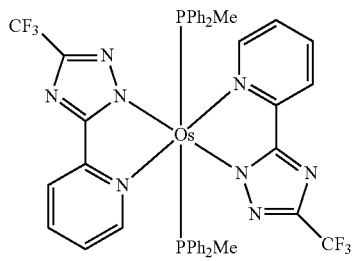
PD74
PD75 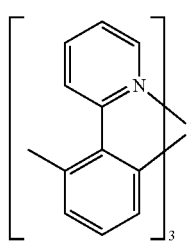

PD76 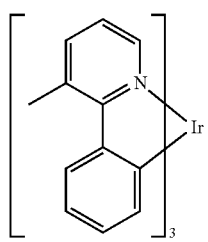
PD77 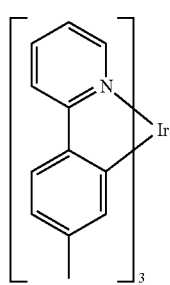
PD78 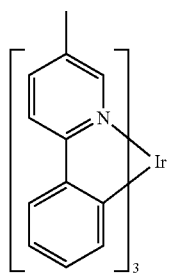
PD79(FIr6) 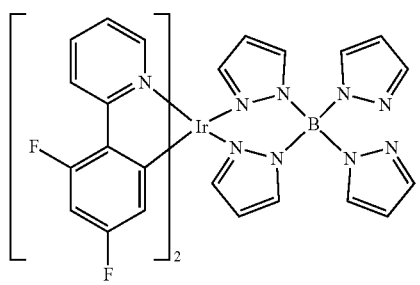
PD80 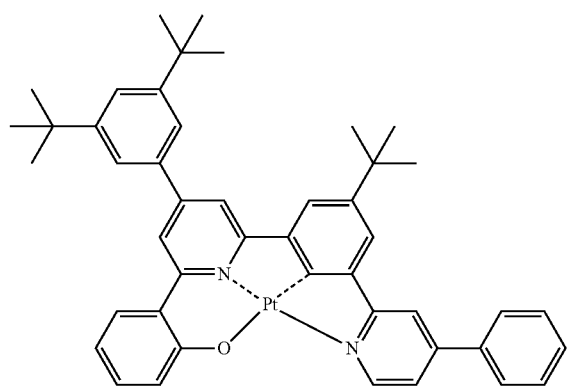
PD81 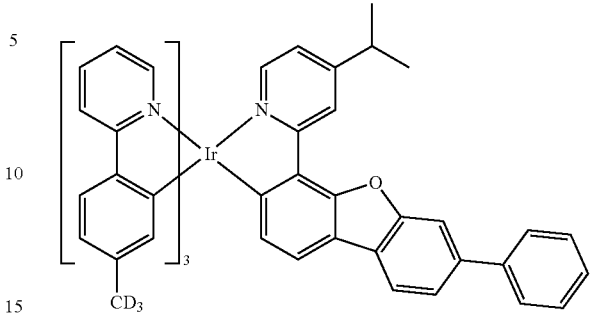
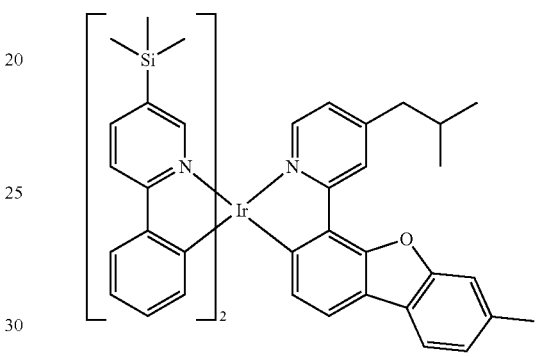
PD83 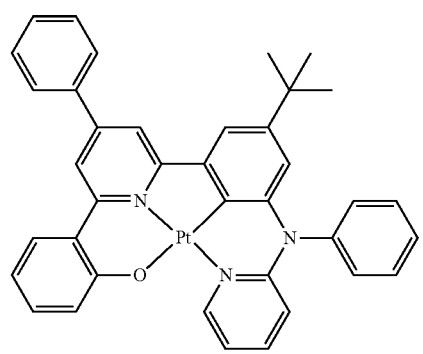
PD84 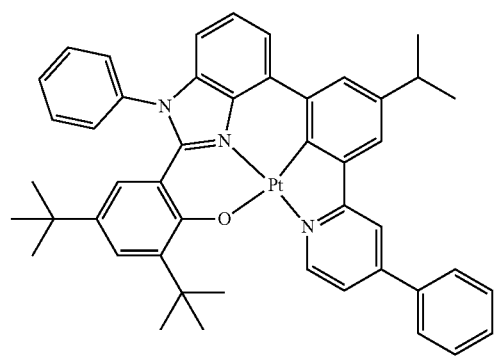

PD85

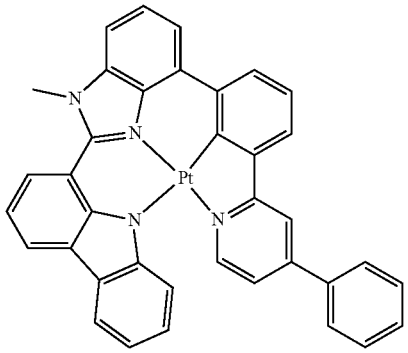

PD86

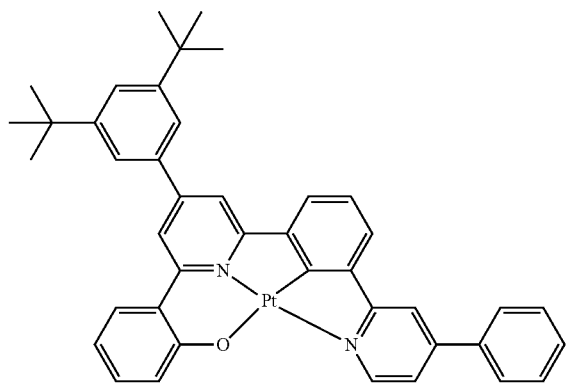

$A_2$ of Formula 1 may be a monovalent group derived from a fluorescent luminescent compound, which is a compound capable of emitting fluorescent light.

The fluorescence may be a prompt fluorescence, a delayed fluorescence, or the like. The delayed fluorescence may be thermally activated delayed fluorescence (TADF).

In one or more embodiments, the fluorescent luminescent compounds may be a thermally activated delayed fluorescence emitter. The thermally activated delayed fluorescence emitter may be any compound that is capable of emitting delayed fluorescence according to the thermally activated delayed fluorescence emission mechanism.

The difference (absolute value) between the triplet ($T_1$) energy level (electron volts, eV) of the thermally activated delayed fluorescence emitter and the singlet ($S_1$) energy level (eV) of the thermally activated delayed fluorescence emitter may be equal to or greater than 0 eV and less than or equal to about 0.5 eV. When the difference between the triplet ($T_1$) energy level (eV) of the thermally activated delayed fluorescence emitter and the singlet ($S_1$) energy level (eV) of the thermally activated delayed fluorescence emitter satisfies the above range, the up-conversion from the triplet state to the singlet state may be effectively achieved, so that the thermally activated delayed fluorescence emitter may emit high-efficiency delayed fluorescence.

For example, the fluorescent luminescent compounds may be amino group-containing condensed cyclic compounds, compounds containing donors and acceptors, boron-containing compounds, and the like.

For example, the fluorescent luminescent compounds may be one or more compounds represented by Formula 501:

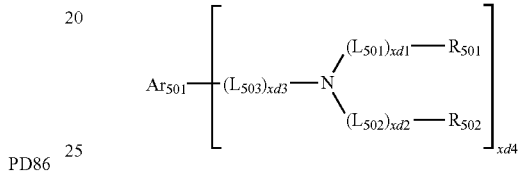

Formula 501 wherein, in Formula 501, $Ar_{501}$ may be a naphthalene, a heptalene, a fluorene, a spiro-bifluorene, a carbazole, a benzofluorene, a dibenzofluorene, a phenalene, a phenanthrene, an anthracene, a fluoranthene, a triphenylene, a pyrene, a chrysene, a naphthacene, a picene, a perylene, a pentaphene, or an indenoanthracene, each substituted or unsubstituted with at least one $R_{10a}$, $L_{501}$ to $L_{503}$ may each independently be a $C_5$-$C_{30}$ carbocyclic group that is unsubstituted or substituted with at least one $R_{10a}$, or a $C_2$-$C_{30}$ heterocyclic group that is unsubstituted or substituted with at least one $R_{10a}$, $R_{501}$ and $R_{502}$ may each independently be a phenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each unsubstituted or substituted with at least one $R_{10a}$, xd1 to xd3 may each independently be an integer from 0 to 3, and xd4 may be an integer from 0 to 4.

For example, xd4 of Formula 501 may be an integer from 2 to 4.

$R_{10a}$ is as described in connection with $R_{10}$.

A compound represented by Formula 501 may emit prompt fluorescence.

For example, $A_2$ of Formula 1 may be a monovalent group derived from one of Compounds FD1 to FD14 or one of FD(1) to FD(17):

33           34
FD1 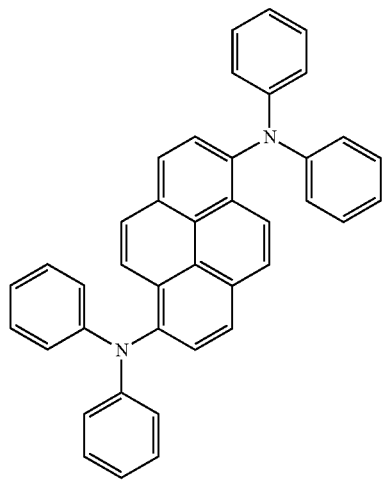    FD2 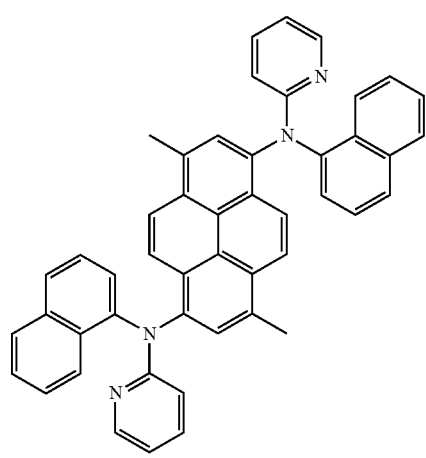
FD3 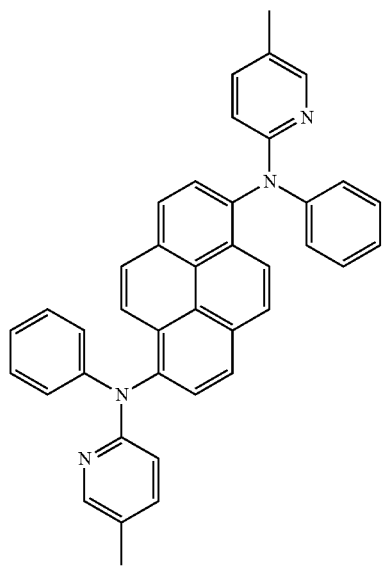    FD4 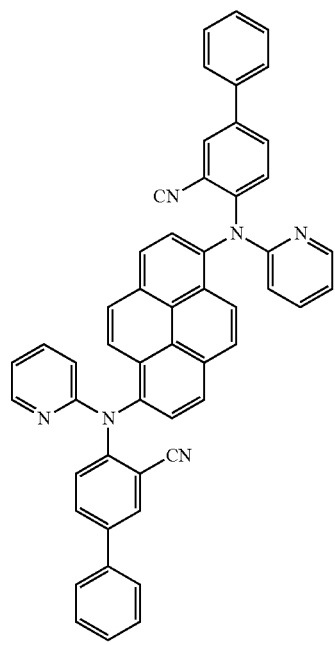
FD5 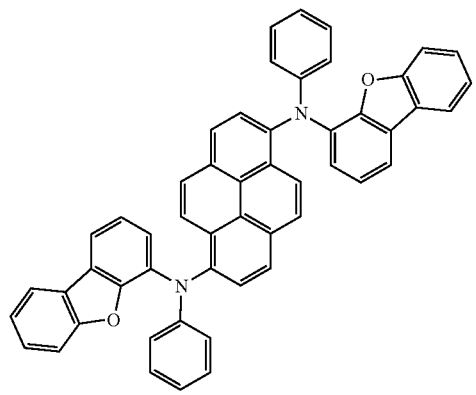    FD6 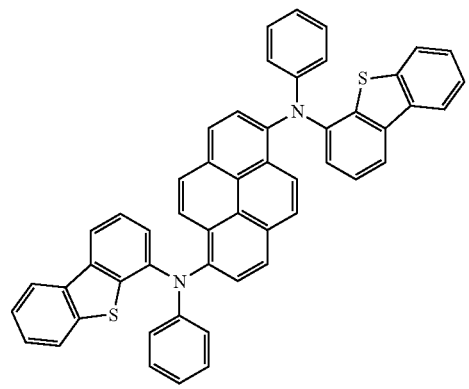

-continued
FD7
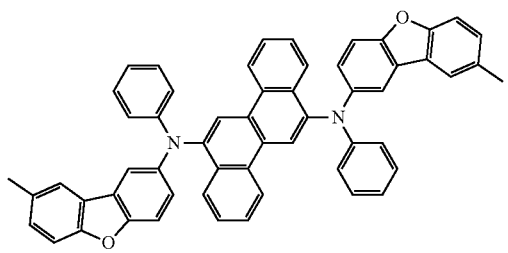
FD8
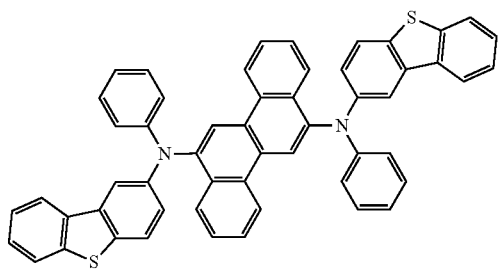
FD9
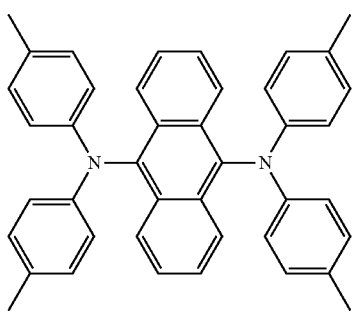
FD10
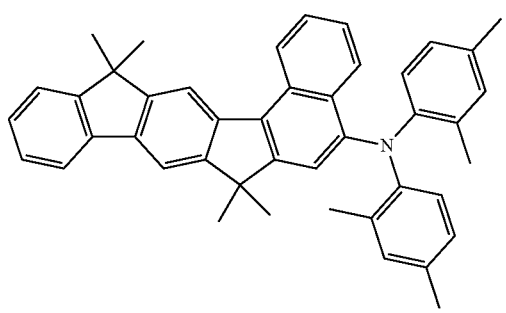
FD11
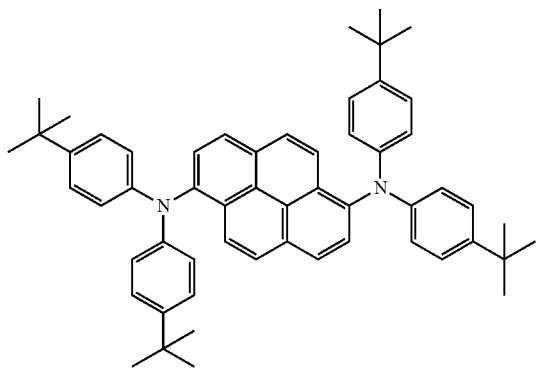
FD12
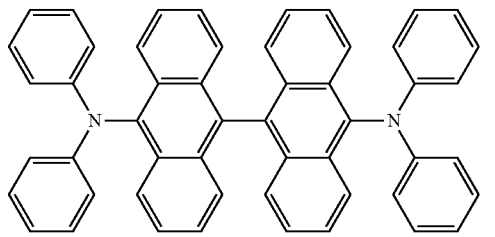
FD13
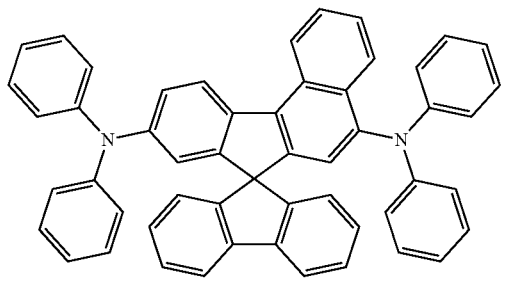
FD14
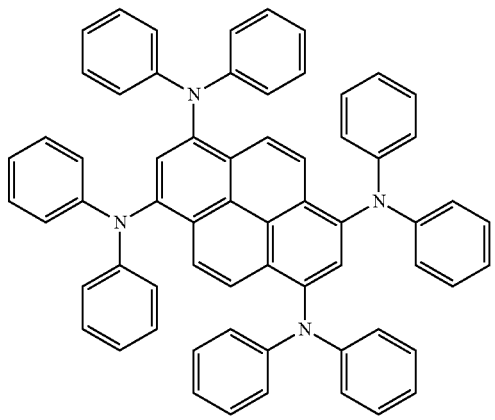

-continued
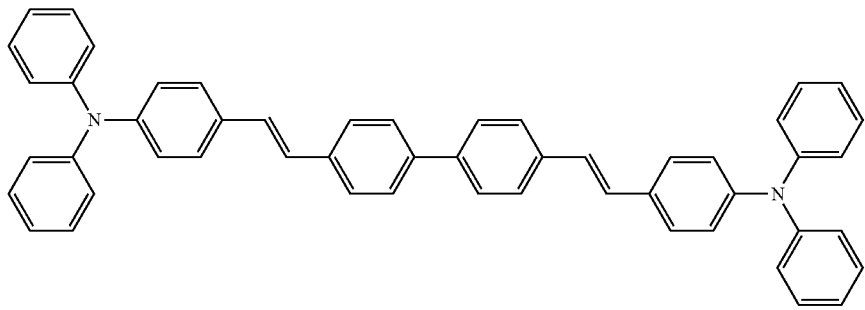
FD(1)
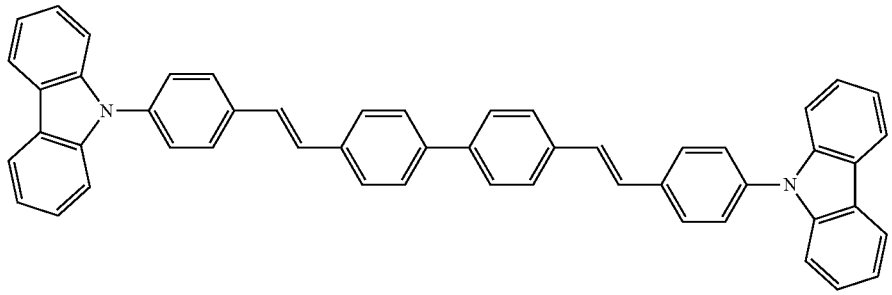
FD(2)
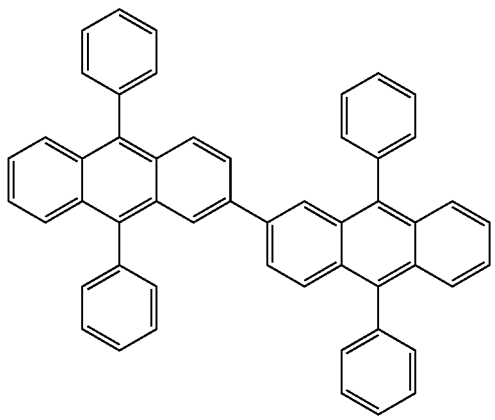
FD(3)
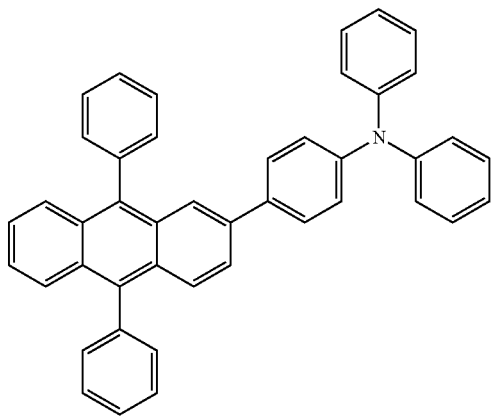
FD(4)
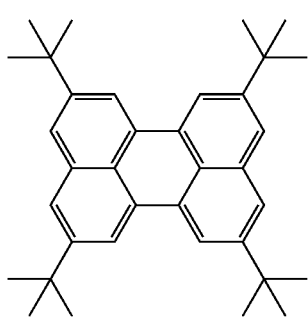
FD(5)
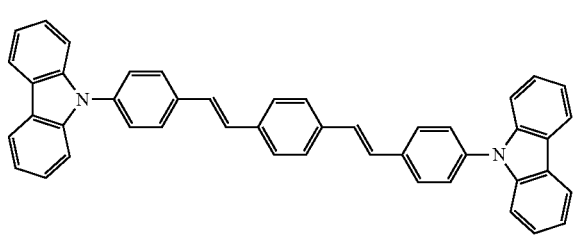
FD(6)
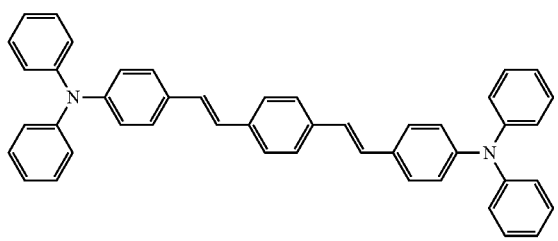
FD(7)
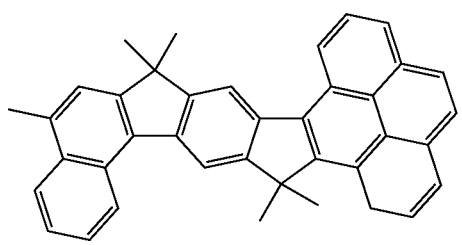
FD(8)

-continued
FD(9)
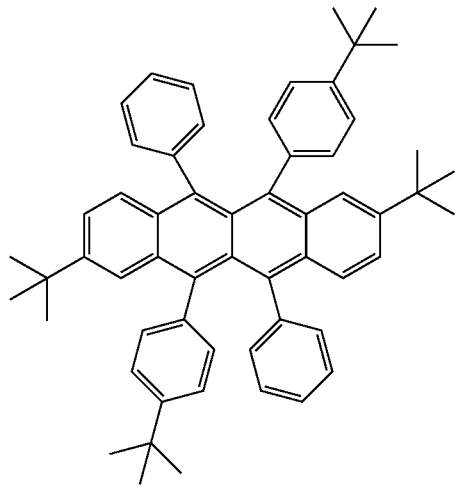
FD(10)
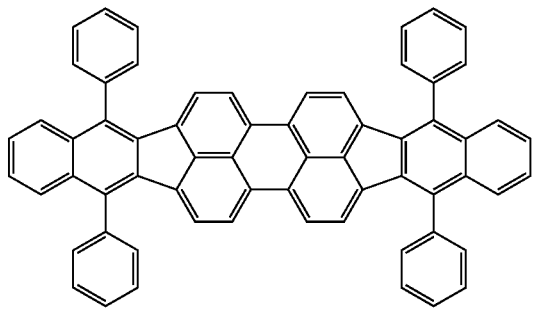
(FD11)
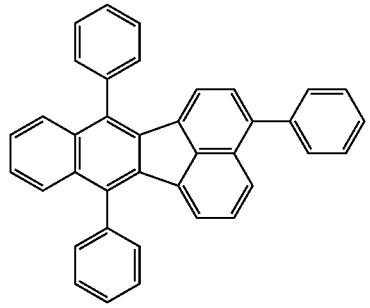
FD(12)
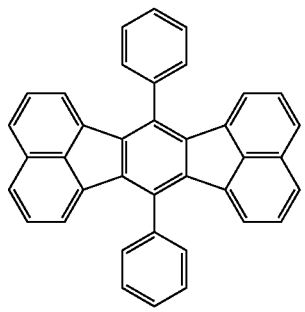
FD(13)
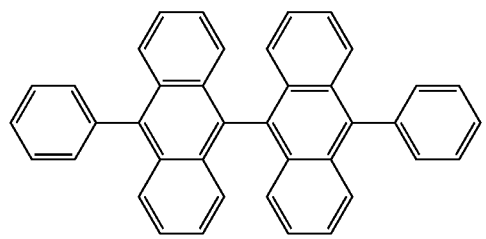
FD(14)
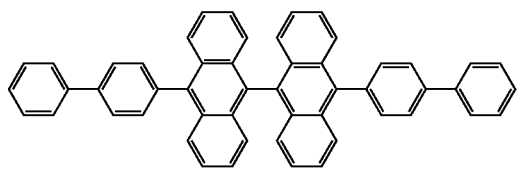
FD(15)
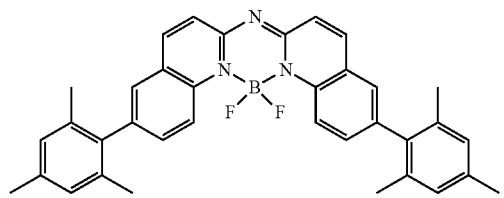
FD(16)
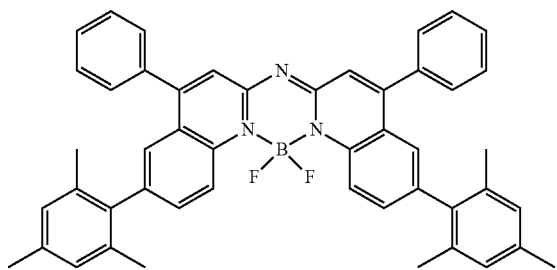
FD(17)
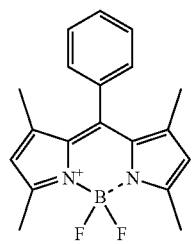

In one or more embodiments, the fluorescent luminescent compounds may include a compound represented by Formula 11:

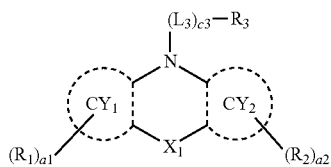

Formula 11>

$X_1$ in Formula 11 may be a single bond, $N-[(L_4)_{ca}-R_4]$, $C(R_5)(R_6)$, O, or S.

For example, $X_1$ may be a single bond, but embodiments of the present disclosure are not limited thereto.

Ring $CY_1$ and ring $CY_2$ in Formula 11 may each independently be a phenyl group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group.

For example, ring $CY_1$ and ring $CY_2$ may each independently be a phenyl group, a fluorene group, a carbazole group, a dibenzofuran group, a dibenzothiophene group, or a dibenzosilole group, and at least one of ring $CY_1$ and ring $CY_2$ may each independently be a phenyl group, but embodiments of the present disclosure are not limited thereto.

$L_3$ and $L_4$ may each independently be a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

For example, $L_3$ and $L_4$ may each independently be a phenyl group, a naphthalene group, a fluorene group, a pyridine group, a pyrimidine group, a pyrazine group, a pyridazine group, a triazine group, a quinoline group, an isoquinoline group, a carbazole group, a dibenzofuran group, a dibenzothiophene group, or an indolocarbazole group, each unsubstituted or substituted with at least one $R_{10a}$.

c3 and c4 each indicates the number of $L_3$ and the number of $L_4$, respectively, and may each independently be an integer of 0 to 4. When c3 is 2 or greater, two or more $L_3$ may be identical to or different from each other, and when c4 is 2 or greater, two or more $L_4$ may be identical to each other or different from each other. For example, c3 and c4 may each independently be 0, 1, or 2, but embodiments of the present disclosure are not limited thereto. In one or more embodiments, when c3 is 0, *-$(L_3)_{c3}$-*$^1$ may be a single bond, and when c4 is 0, *-$(L_4)_{c4}$-*' may be a single bond.

$R_1$ to $R_6$ in Formula 11 are as described in connection with $R_{10}$.

In one or more embodiments, $R_3$ in Formula 11 may include at least one π electron- deficient nitrogen-containing cyclic group.

The term "π electron-deficient nitrogen-containing cyclic group" as used herein refers to a group having a cyclic group having at least one *—N=*' moiety. In one or more embodiments, the π electron-deficient nitrogen-containing cyclic group may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an iso-benzothiazole group, a benzoxazole group, a benzoisoxazole group, a triazole group, a tetrazole group, an oxadiazole group, a triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, or an azadibenzosilole group.

In one or more embodiments, $R_3$ in Formula 11 may be:
a phenyl group, an indenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a pyrrolyl group, an isoindolyl group, an indolyl group, a furanyl group, a thiophenyl group, a silolyl group, a benzofuranyl group, a benzothiophenyl group, a benzosilolyl group, a carbazolyl group, a dibenzofuranyl group, a dibenzothiophenyl group, a dibenzosilolyl group, an indeno carbazolyl group, an indolocarbazolyl group, a benzofurocarbazolyl group, a benzothienocarbazolyl group, a benzosilolocarbazolyl group, an imidazolyl group, a pyrazolyl group, a thiazolyl group, an isothiazolyl group, an oxazolyl group, an isoxazolyl group, a pyridinyl group, a pyrazinyl group, a pyridazinyl group, a pyrimidinyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a cinnolinyl group, a phenanthridinyl group, an acridinyl group, a phenanthrolinyl group, a phenazinyl group, a benzoimidazolyl group, a benzoisothiazolyl group, a benzoxazolyl group, a isobenzoxazolyl group, a triazolyl group, a tetrazolyl group, an oxadiazolyl group, a triazinyl group, a thiadiazolyl group, a imidazopyridinyl group, an imidazopyrimidinyl group, an azaindenyl group, an azaindolyl group, an azabenzofuranyl group, an azabenzothiophenyl group, an azabenzosilolyl group, an azafluorenyl group, an azacarbazolyl group, an azadibenzofuranyl group, an azadibenzothiophenyl group, or an azadibenzosilolyl group, each substituted or unsubstituted with deuterium a $C_1$-$C_{10}$ alkyl group, a $C_1$-$C_{10}$ alkoxy group, a $C_1$-$C_{10}$ alkylthio group, a phenyl group a ($C_1$-$C_{10}$ alkyl)phenyl group, a di($C_1$-$C_{10}$ alkyl)phenyl group, a biphenyl group, a terphenyl group, a di(phenyl)phenyl group, a di(biphenyl)phenyl group, a (pyridinyl)phenyl group, a di(pyridinyl)phenyl group, a (pyrimidinyl)phenyl group, a di(pyrimidinyl)

phenyl group, a (triazinyl)phenyl group, a di(triazinyl) phenyl group, a pyridinyl group, a ($C_1$-$C_{10}$ alkyl) pyridinyl group, a di($C_1$-$C_{10}$ alkyl)pyridinyl group, a (phenyl)pyridinyl group, a di(phenyl)pyridinyl group, a (biphenyl)pyridinyl group, a di(biphenyl)pyridinyl group, a (terphenyl)pyridinyl group, a bi(terphenyl) pyridinyl group, a (pyridinyl)pyridinyl group, a di(pyridinyl)pyridinyl group, a (pyrimidinyl)pyridinyl group, a di(pyrimidinyl)pyridinyl group, a (triazinyl) pyridinyl group, a di(triazinyl)pyridinyl group, a pyrimidinyl group, a ($C_1$-$C_{10}$ alkyl)pyrimidinyl group, a di($C_1$-$C_{10}$ alkyl)pyrimidinyl group, a (phenyl)pyrimidinyl group, a di(phenyl)pyrimidinyl group, a (biphenyl)pyrimidinyl group, a di(biphenyl)pyrimidinyl group, a (terphenyl)pyrimidinyl group, a bi(terphenyl) pyrimidinyl group, a (pyridinyl)pyrimidinyl group, a di(pyridinyl)pyrimidinyl group, a (pyrimidinyl)pyrimidinyl) group, a di(pyrimidinyl)pyrimidinyl group, a (triazinyl)pyrimidinyl group, a di(triazinyl)pyrimidinyl group, a triazinyl group, a ($C_1$-$C_{10}$ alkyl)triazinyl group, a di($C_1$-$C_{10}$ alkyl)triazinyl group, a (phenyl) triazinyl group, a di(phenyl)triazinyl group, a (biphenyl)triazinyl group, a di(biphenyl)triazinyl group, a (terphenyl)triazinyl group, a bi(terphenyl)triazinyl group, a (pyridinyl)triazinyl group, a di(pyridinyl)triazinyl group, a (pyrimidinyl)triazinyl group, a di(pyrimidinyl)triazinyl group, a (triazinyl)triazinyl group, a di(triazinyl)triazinyl group, a fluorenyl group, a di($C_1$-$C_{10}$ alkyl)fluorenyl group, a di(phenyl)fluorenyl group, a di(biphenyl)fluorenyl group, a carbazolyl group, a ($C_1$-$C_{10}$ alkyl)carbazolyl group, a (phenyl)carbazolyl group, a (biphenyl)carbazolyl group, a dibenzofuranyl group, a ($C_1$-$C_{10}$ alkyl)dibenzofuranyl group, a (phenyl)dibenzofuranyl group, a (biphenyl)dibenzofuranyl group, a dibenzothiophenyl group, a ($C_1$-$C_{10}$ alkyl) dibenzothiophenyl group, a (phenyl)dibenzothiophenyl group, a (biphenyl)dibenzothiophenyl group, or a combination thereof.

In one or more embodiments, the fluorescent luminescent compounds may include a compound represented by Formula 14A:

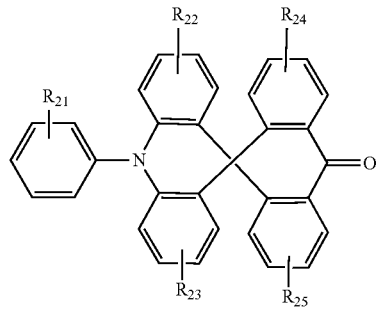

Formula 14A $R_{21}$ to $R_{25}$ in Formula 14A may each independently be hydrogen, deuterium, a cyano group, a $C_1$-$C_{10}$ alkyl group, a phenyl group, a biphenyl group, ora terphenyl group.

In one or more embodiments, $A_2$ in Formula 1 may be a monovalent group derived from one of Compounds D1-1 to D1-19:

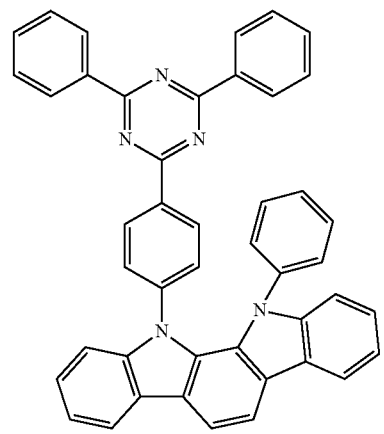

D1-1

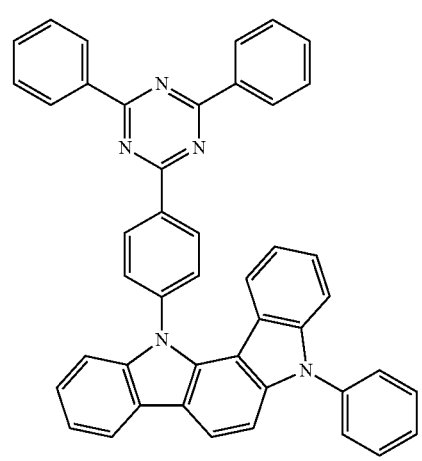

D1-2

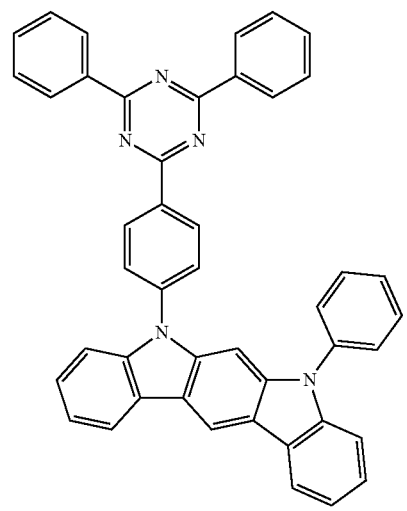

D1-3

-continued
D1-4
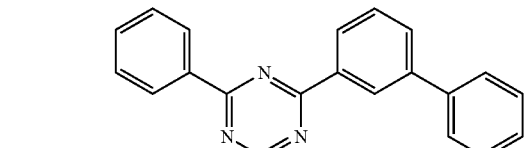
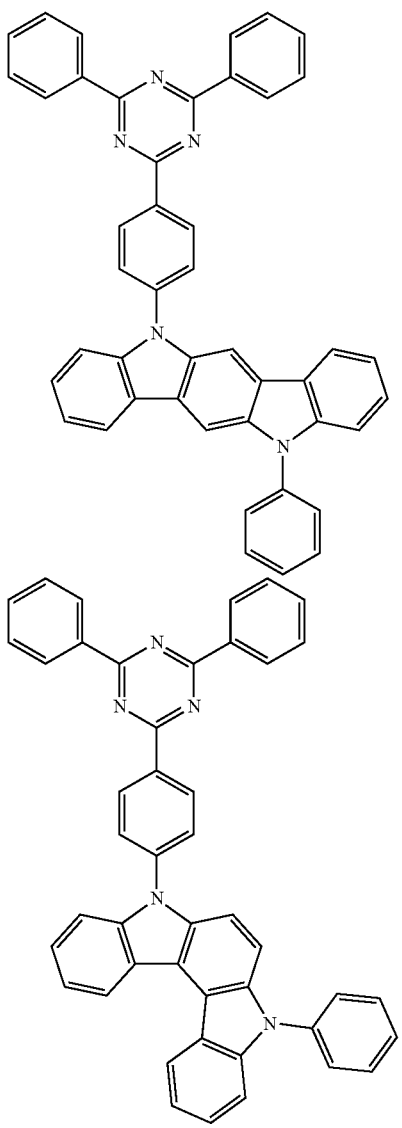
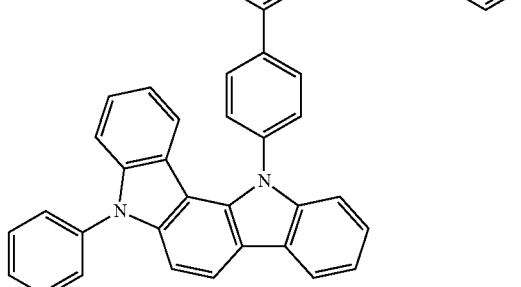
D1-7
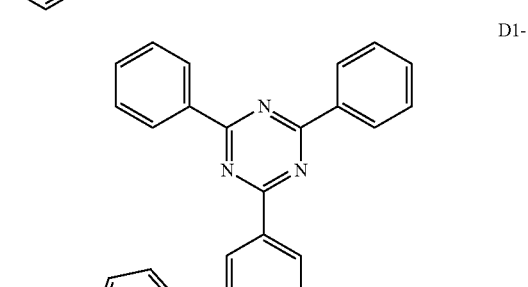
D1-8
D1-5
D1-6
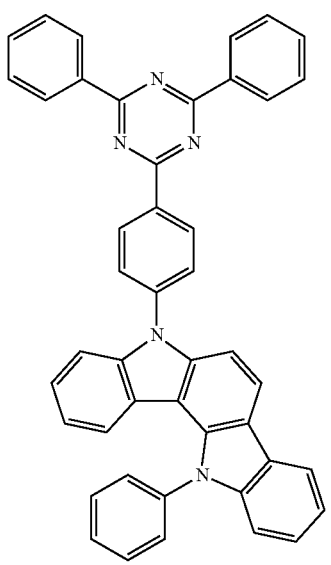
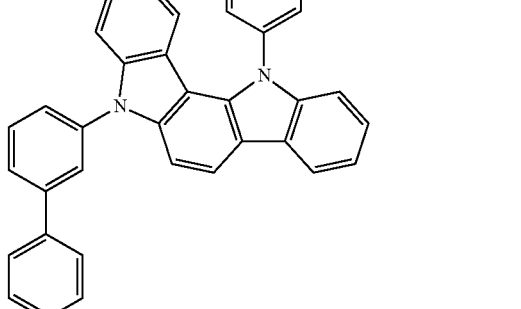
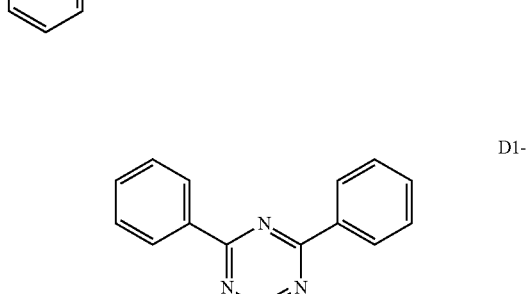
D1-9

D1-10
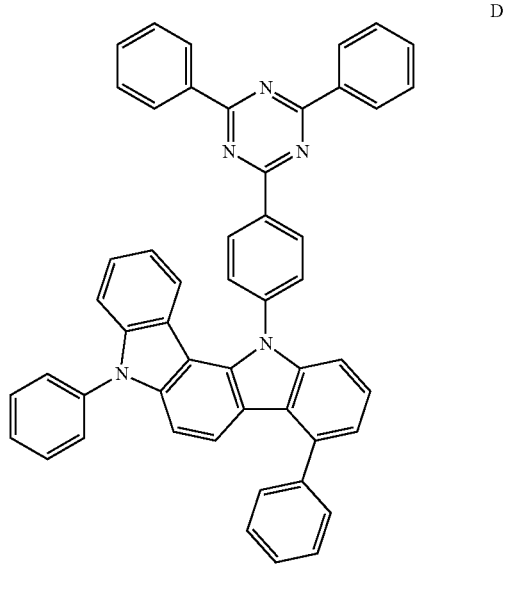
D1-11
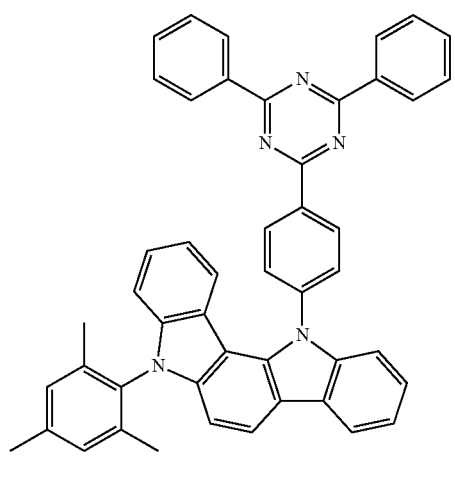
D1-12
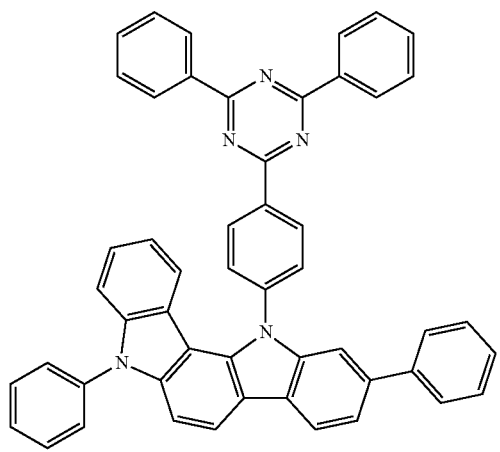
D1-13
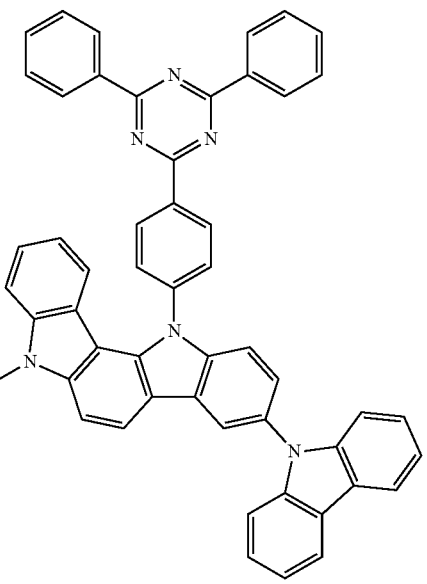
D1-14
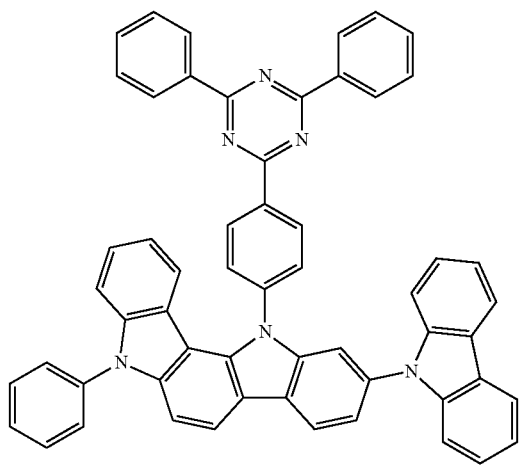
D1-15
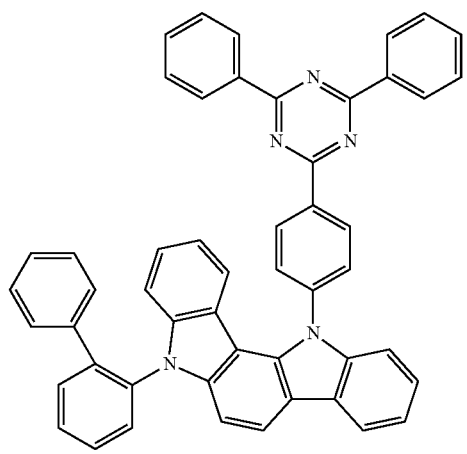

D1-16

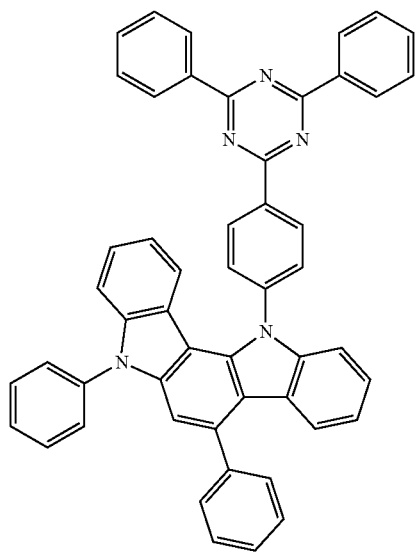

D1-17

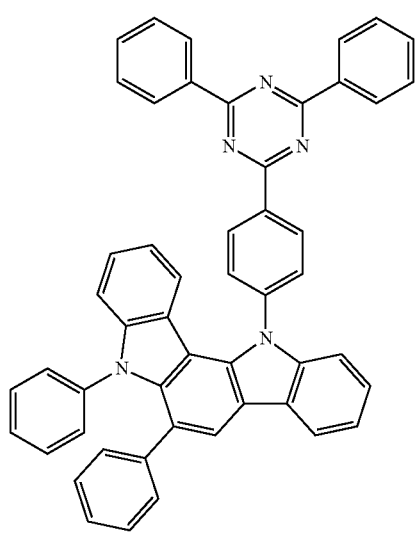

D1-18

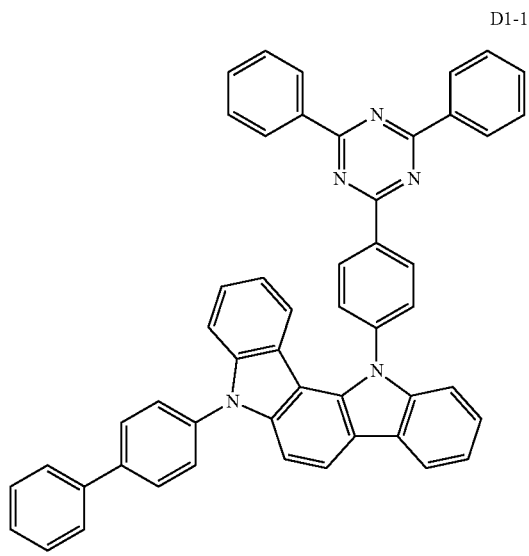

D1-19

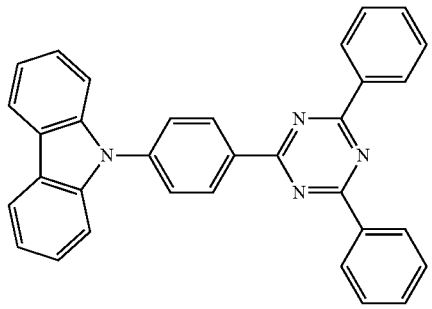

$A_2$ of Formula 1 may be a monovalent group derived from a quantum dot.

The term "quantum dot" as used herein refers to a crystal of a semiconductor compound, and may include all suitable materials that emit different lengths of emission wavelengths depending on the size of the crystal. A diameter of the quantum dot may be, for example, in a range of about 1 nm to about 10 nm.

In one or more embodiments, the quantum dot may be a Group III-VI semiconductor compound; a Group II-VI semiconductor compound; a Group III-V semiconductor compound; a Group IV-VI semiconductor compound; a Group IV element or compound; or a combination thereof.

For example, the Groups III-VI semiconductor compound may include a binary compound, such as $In_2S_3$, a ternary compound, such as AgInS, $AgInS_2$, CuInS, or $CuInS_2$, or a combination thereof.

For example, the Groups II-VI semiconductor compound may include a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or a combination thereof.

For example, the Groups III-V semiconductor compound may include a binary compound, such as GaN, GaP, GaAs, GaSb, AlN, AlP, AlAs, AlSb, InN, InP, InAs, or InSb, a ternary compound, such as GaNP, GaNAs, GaNSb, GaPAs, GaPSb, AlNP, AlNAs, AlNSb, AlPAs, AlPSb, InGaP, InNP, InNAs, InNSb, InPAs, InPSb, or GaAlNP, a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb, or a combination thereof.

For example, the Group IV-VI semiconductor compound may include a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or a combination thereof.

For example, the Group IV element or compound may include a single element compound, such as Si or Ge; a binary compound, such as SiC or SiGe; or a combination thereof.

In this regard, respective elements included in the binary compound, the ternary compound, and/or the quaternary compound may exist in particles at uniform concentration or may exist in the same particle in a state in which a concentration distribution is partially different.

Meanwhile, the quantum dot may have a single structure in which the concentration of each element in the quantum dot is uniform, or a core-shell dual structure. For example, the material included in the core and the material included in the shell may be different from each other.

The shell of the quantum dot may act as a protective layer that prevents or limits the chemical degeneration of the core to maintain semiconductor characteristics, and/or as a charging layer that imparts electrophoretic characteristics to the quantum dot. The shell may be a single layer or a multi-layer. The interface between the core and the shell may have a concentration gradient in which the concentration of an element existing in the shell decreases in relative concentration towards the center of the core and increases in relative concentration away from the center of the core.

Examples of the shell of the quantum dot may be an oxide of a metal, or a non-metal, a semiconductor compound, or a combination thereof. For example, the metal or the non-metal may be an oxide that may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CPO, $Co_3O_4$, or NiO, or a ternary compound, such as $MgAl_2O_4$, $CoFe_2O_4$, $NiFe_2O_4$, or $CoMn_2O_4$, but embodiments of the present disclosure are not limited thereto. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but embodiments of the present disclosure are not limited thereto.

The quantum dot may be a spherical particle, a pyramidal particle, a multi-arm particle, a cubic nanoparticle, a nanotube particle, a nanowire particle, a nanofiber particle, a nanoplate particle, or a combination thereof, but embodiments of the present disclosure are not limited thereto.

m1 and m2 in Formula 1 each indicates the number of $A_1$ and the number of $A_2$, respectively, and are each independently be an integer from 1 to 10. When m1 is 2 or greater, two or more $A_1$ are identical to or different from each other, and when m2 is 2 or greater, two or more $A_2$ are identical to or different from each other. For example, m1 may be an integer from 1 to 5, and m2 may be 1 or 2.

Figure 2:
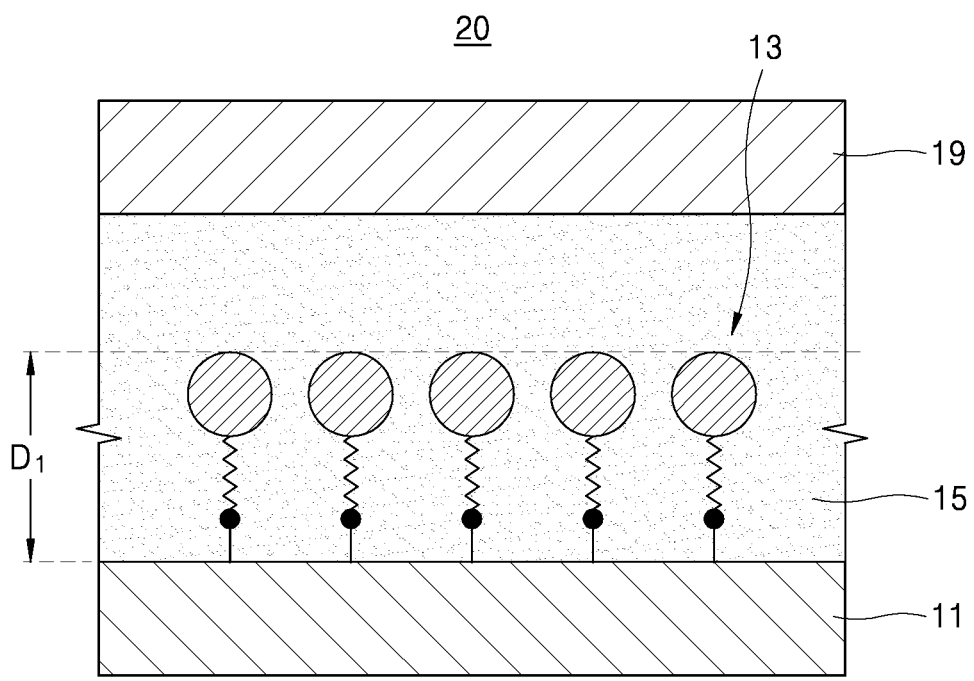
FIG. 2 is a schematic cross-sectional view showing a light-emitting device according to one or more embodiments.

Description of FIG. 2

FIG. 2 is a schematic cross-sectional view showing a light-emitting device 20 according to one or more embodiments.

A carbon-containing film 11, a light-emitting group 13, and the thickness ($D_1$) of a monolayer including a plurality of light-emitting groups 13 of the light-emitting device 20 may be understood by referring to the carbon-containing film 11, the light-emitting group 13, and the thickness ($D_1$) of the monolayer including the plurality of light-emitting group 13 of the light-emitting device 10 in FIG. 1, respectively.

The light-emitting device 20 may further include a conductive film 19 facing the carbon-containing film 11, and the light-emitting group 13 of the light-emitting device 20, that is, $A_2$ of Formula 1 may be located towards the conductive film 19 and away from the surface of the carbon-containing film 11.

The carbon-containing film 11 may be an anode, and the conductive film 19 may be a cathode. In one or more embodiments, a material for forming the conductive film 19 may be a metal, an alloy, an electrically conductive compound, or a combination thereof, each of which may have a relatively low work function. For example, lithium (Li), magnesium (Mg), aluminum (Al), silver (Ag), aluminum-lithium (Al—Li), calcium (Ca), magnesium-indium (Mg—In), or magnesium-silver (Mg—Ag) may be used as the material for forming the conductive film 19.

Besides the light-emitting group 13, an interlayer 15 may be additionally located between the carbon-containing film 11 and the conductive film 19. At least a portion of the light-emitting group 13 may be located to be included within the interlayer 15.

The interlayer 15 may include: a hole transport material, a light-emitting material, an electron transport material, or a combination thereof; or an insulating material, an electrolyte, air, or an inert gas, and thus may maintain the structure of the light-emitting device 20, and may assist charge transfer inside the light-emitting group 13.

The hole transport material, the light-emitting material, and the electron transport material, which may be included in the interlayer 15, may respectively be any suitable hole transport material, any suitable light-emitting material, and any suitable electron transport material, which may be located between a pair of electrodes of an organic light-emitting device of the related art.

In addition, when the interlayer 15 includes a hole transport material, a light-emitting material, an electron transport material, or a combination thereof, a hole transport region including a hole injection layer, a hole transport layer, an electron-blocking layer, a buffer layer, or a combination thereof and/or an electron transport region including a hole-blocking layer, an electron transport layer, an electron injection layer, or a combination thereof may be included.

The hole transport material may be 4,4',4"-tris(3-methylphenylphenylamino)triphenylamine (m-MTDATA), 4,4',4"-tris(N, N-diphenylamino)triphenylamine (TDATA), 4,4',4"-tris{N-(2-naphthyl)-N-phenylamino}-triphenylamine (2-TNATA), N,N'-di(1-naphthyl)-N,N'-diphenylbenzidine (NPB), β-NPB, N,N'-bis(3-methylphenyl)-N,N'-diphenyl-[1,1-biphenyl]-4,4'-diamine (TPD), spiro-TPD, spiro-NPB, methylated NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 4,4',4"-tris(N-carbazolyl)triphenylamine (TCTA), polyaniline/dodecyl benzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or a combination thereof:

-continued
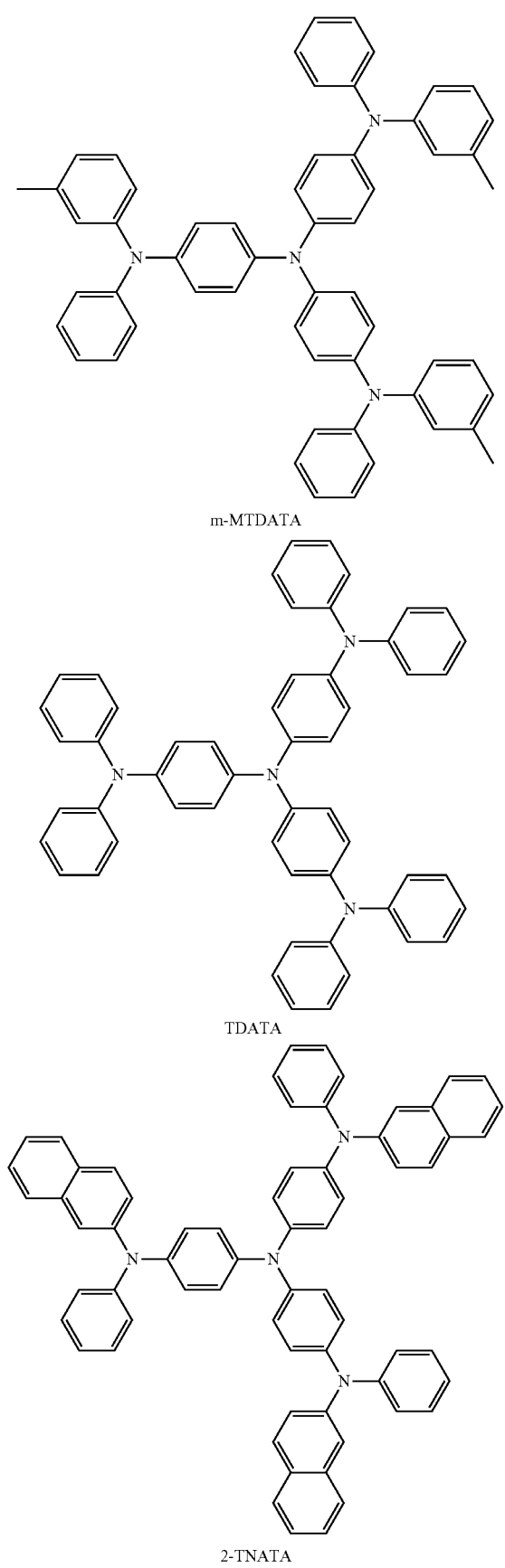
m-MTDATA
TDATA
2-TNATA
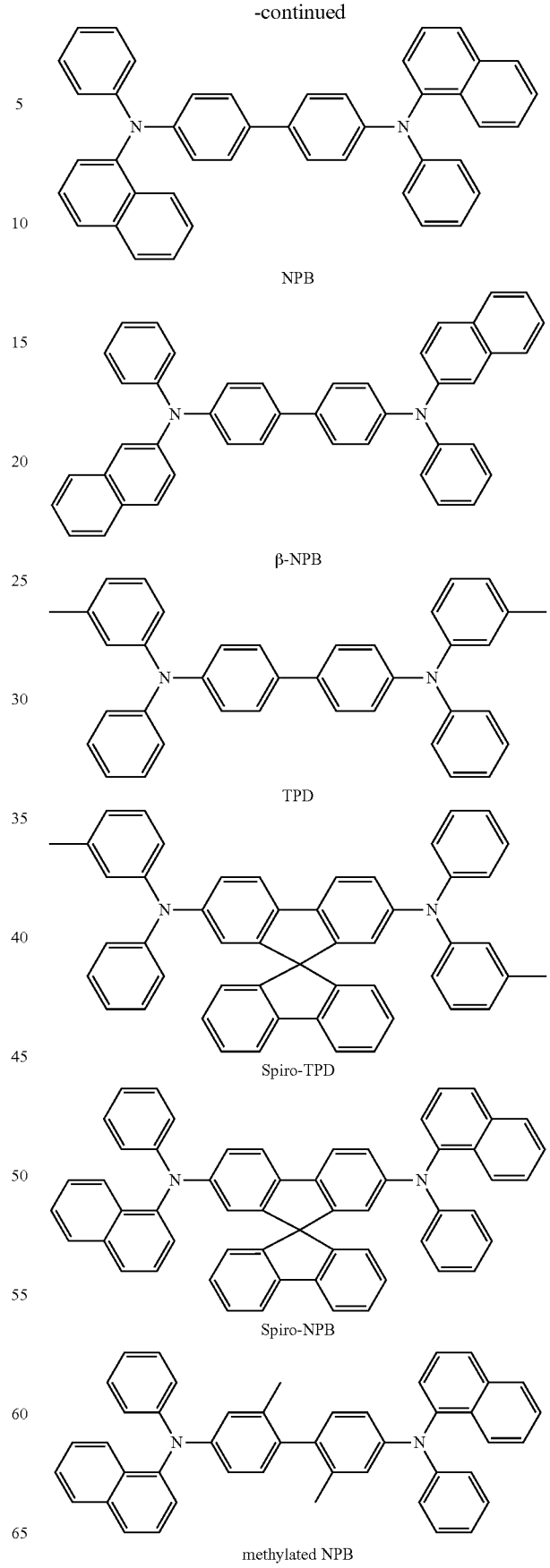
NPB
β-NPB
TPD
Spiro-TPD
Spiro-NPB
methylated NPB

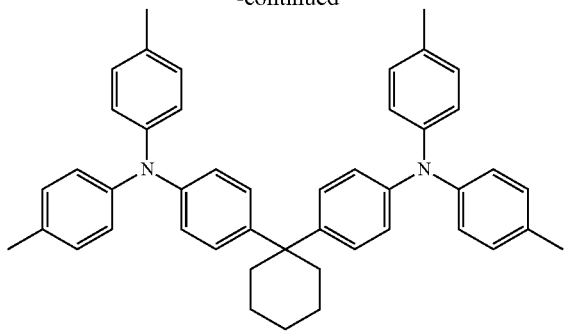

TAPC

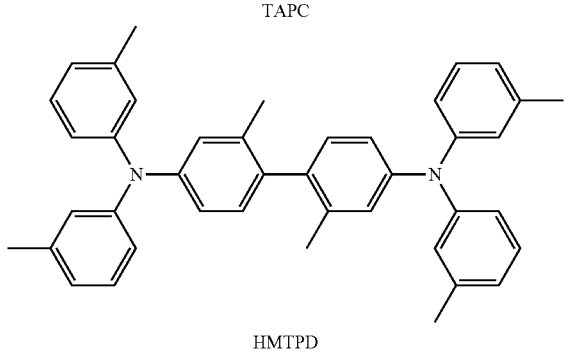

HMTPD

Formula 201

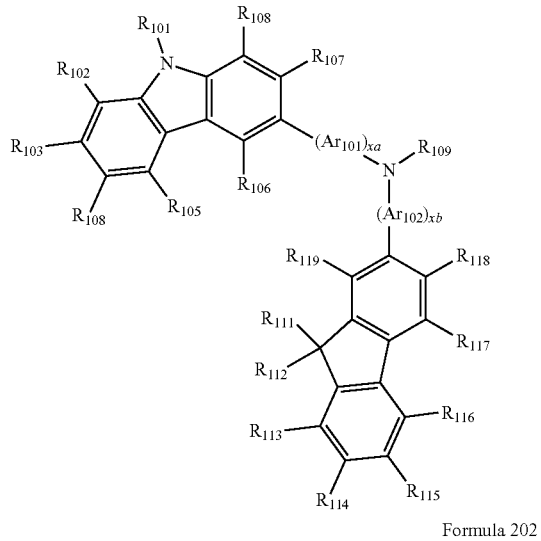

Formula 202

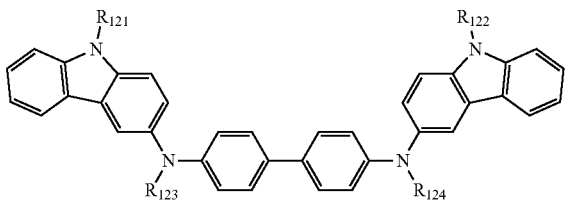

$Ar_{101}$ and $Ar_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with at least one of deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_8$-$C_{80}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof.

xa and xb in Formula 201 may each independently be an integer from 0 to 5, or 0, 1, or 2. For example, xa may be 1 and xb may be 0.

$R_{101}$ to $R_{108}$, $R_{111}$ to $R_{110}$ and $R_{121}$ to $R_{124}$ in Formulae 201 and 202 may each independently be:

hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like), a $C_1$-$C_{10}$ alkoxy group (for example, a methoxy group, an ethoxy group, a propoxy group, a butoxy group, a pentoxy group, or the like), or a $C_1$-$C_{10}$ alkylthio group;

a $C_1$-$C_{10}$ alkyl group, a $C_1$-$C_{10}$ alkoxy group, or a $C_1$-$C_{10}$ alkylthio group, each substituted with at least one of deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, an anthracenyl group, a fluorenyl group, or a pyrenyl group, each unsubstituted or substituted with at least one of deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_1$-$C_{10}$ alkylthio group, or a combination thereof.

$R_{109}$ in Formula 201 may be a phenyl group, a naphthyl group, an anthracenyl group, or a pyridinyl group, each unsubstituted or substituted with at least one of deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{10}$ alkylthio group, a phenyl group, a naphthyl group, an anthracenyl group, a pyridinyl group, or a combination thereof.

As the light-emitting material, any host that can be used in the emission layer of an organic light-emitting device may be used.

Examples of the host may include at least one of 1,3,5-tri(1-phenyl-1H-benzo[d]imidazol-2-yl)phenyl (TPBi), 3-tert-butyl-9,10-di(naphth-2-yl)anthracene (TBADN), 9,10-di(naphthalene-2-yl)anthracene (ADN, also referred to as "DNA"), 4,4'-bis(N-carbazolyl)-1,1'-biphenyl (CBP), 4,4'-bis(9-carbazolyl)-2,2'-dimethyl-biphenyl (CDBP), N,N'N''-1,3,5-tricarbazoloylbenzene (TCP), 1,3-bis(carbazol-9-yl)benzene (mCP), Compound H50, Compound H51, or a combination thereof:

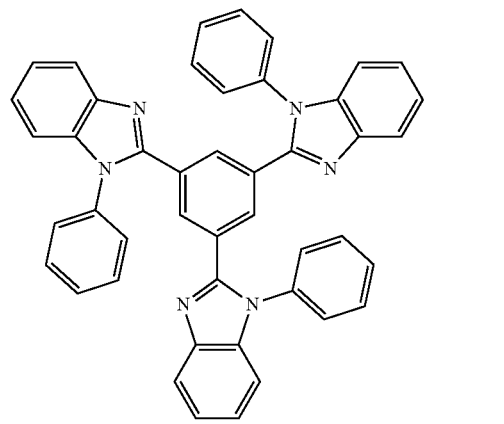

TPBi

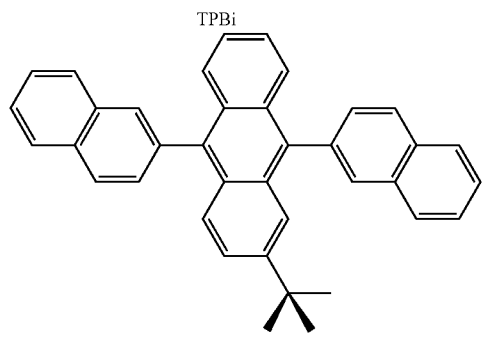

TBADN

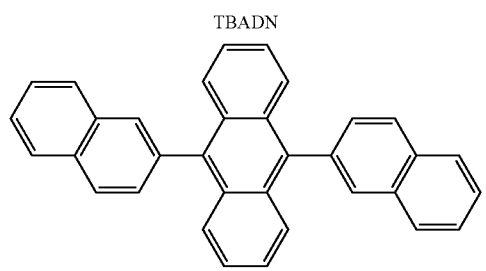

ADN

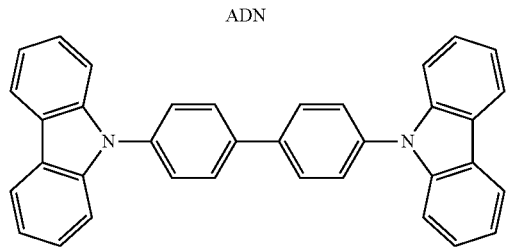

CBP

-continued

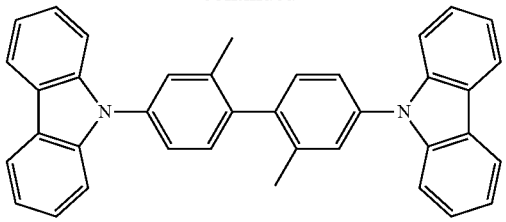

CDBP

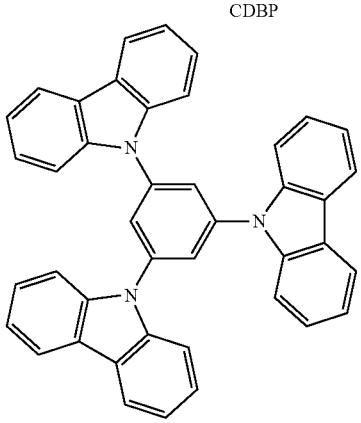

TCP

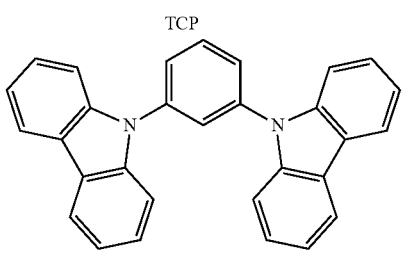

mCP

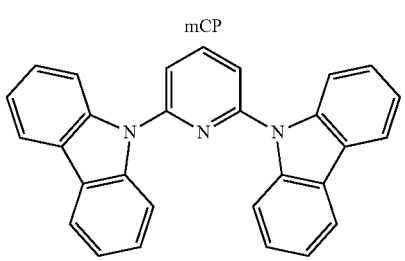

H50

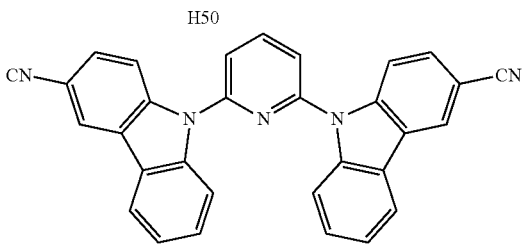

H51

The electron transport material may include, for example, at least one of 2,9-dimethyl-4,7-diphenyl-1,10-phenanthroline (BCP), 4,7-diphenyl-1,10-phenanthroline (Bphen), tris(8-hydroxyquinolinato)aluminum (Alq₃), bis(2-methyl-8-quinolinolato-N1,O8)-(1,1'-biphenyl-4-olato)aluminum (BAlq), 3-(4-biphenylyl)-4-phenyl-5-tert-butylphenyl-1,2, 4-triazole (TAZ), 4-(naphthalen-1-yl)-3,5-diphenyl-4H-1,2,4-triazole (NTAZ), or a combination thereof.

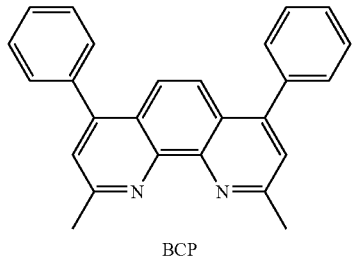

BCP

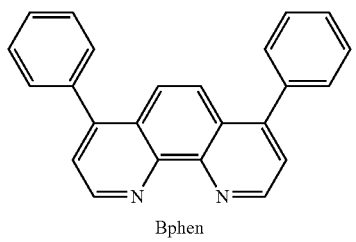

Bphen

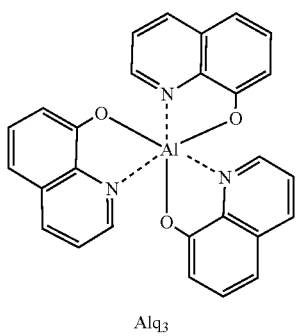

Alq₃

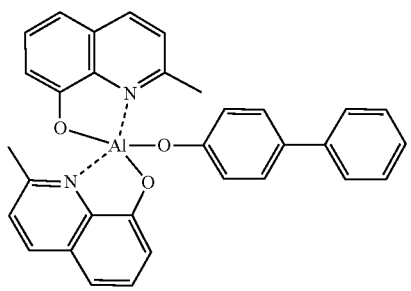

BAlq

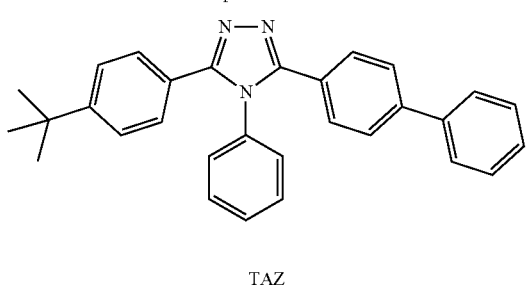

TAZ

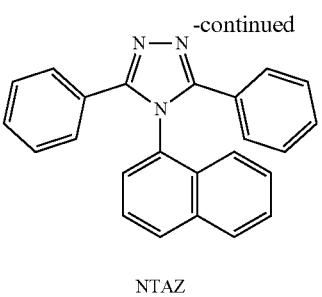

NTAZ

Meanwhile, the interlayer 15 may include an insulating material that is used for a pixel defining layer, an electrolyte that is used for various batteries, and an inert gas such as air or argon gas, depending on the purpose.

When a voltage is applied to the carbon-containing film 11 of each of the light-emitting devices 10 and 20 of FIGS. 1 and 2, light may be emitted from each of the light-emitting groups 13 chemically bonded to a carbon atom of the surface of the carbon-containing film 11.

In one or more embodiments, according to a change in voltage (for example, voltage intensity change) applied to the carbon-containing film 11 of each of the light-emitting devices 10 and 20 of FIGS. 1 and 2, the electron density of the light-emitting group 13 may be changed.

In one or more embodiments, according to a change in voltage applied to the carbon-containing film 11 of each of the light-emitting devices 10 and 20 of FIGS. 1 and 2, the wavelength of light emitted from the light-emitting group 13 may be changed.

In one or more embodiments, according to a continuous change in voltage applied to the carbon-containing film 11 of each of the light-emitting devices 10 and 20 of FIGS. 1 and 2, the wavelength of light emitted from the light-emitting group 13 may be continuously changed.

Since in the light-emitting devices 10 and 20 of FIGS. 1 and 2, the light-emitting group 13 is chemically bonded directly to the at least one carbon atom on the surface of the surface of the carbon-containing film 11, by controlling the voltage applied to the carbon-containing film 11, the intensity and/or the maximum emission wavelength of light emitted from the light-emitting group 13 may be controlled, without a change in the molecular structure of the light-emitting group 13 and/or the light-emitting devices 10 and 20. That is, by controlling the voltage applied to the carbon-containing film 11, not by changing the chemical structure of the light-emitting group 13 and/or the structure of each of the light-emitting devices 10 and 20, light emitted from the light-emitting devices 10 and 20 may be controlled. This is distinguishable from light-emitting devices in which luminescent compound molecules are instead randomly placed on an electrode through a deposition method (for example, vacuum deposition method, or the like) and/or a coating method (for example, a spin coating method, a laser printing method, or the like), and thus, even when the voltage applied to the electrode is changed, the intensity and/or maximum emission wavelength of light emitted from luminescent compound molecules are not able to be changed. Accordingly, the light-emitting devices 10 and 20 may be applicable in various ways to various displays, light sources, and monitors.

In addition, in preparing the light-emitting devices 10 and 20 that emit light having a certain level of color purity, full width half-width (FWHM) and/or maximum emission wavelength ($\lambda_{max}$), the heat resistance and/or electrical stability of the light-emitting group 13 does not need to be compromised. In other words, the light-emitting group 13 having excellent heat resistance and electrical stability is chemically bonded to the at least one carbon atom on the surface of surface of the carbon-containing film 11, and then, the level of color purity, half-width and/or maximum emission wavelength of light emitted from the light-emitting group 13 may be adjusted by controlling the voltage applied to the carbon-containing film 11. Accordingly, without sacrificing the heat resistance and/or electrical stability of the light-emitting group 13 that may affect the lifespan of the light-emitting devices 10 and 20 of FIGS. 1 and 2, the light emitted from the light-emitting devices 10 and 20 may be controlled.

A method of preparing the light-emitting device 10 of FIG. 1 includes:
providing a carbon-containing film 11, wherein the carbon-containing film includes at least one carbon atom; and
contacting the carbon-containing film 11 with a compound represented by Formula 1A and chemically bonding the light-emitting group 13 represented by Formula 1 to the at least one carbon atom on the surface of the carbon-containing film 11:

$A_4\text{-}(C{\equiv}C)\text{-}(A_1)_{m1}\text{-}(A_2)_{m2}$   Formula 1A $*\text{—}(C{\equiv}C)\text{-}(A_1)_{m1}\text{-}(A_2)_{m2}$   Formula 1 wherein, in Formulae 1A and 1,
$A_4$ is an organic moiety,
* indicates a chemical bonding site to the at least one carbon atom on the surface of the carbon-containing film,
$A_1$ is a linking group,
$A_2$ is a group including a light-emitting moiety, and
m1 and m2 are each independently an integer from 1 to 10, wherein, when m1 is 2 or greater, two or more $A_1$ are identical to or different from each other, and when m2 is 2 or greater, two or more $A_2$ are identical to each other or different from each other.
*, a group represented by *—C≡C—*', $A_1$, $A_2$, m1, and m2 in Formulae 1A and 1 are each as described above.

In one or more embodiments, $A_4$ in Formula 1A may be hydrogen ora substituted or unsubstituted $C_1$-$C_{60}$ alkyl group.

In one or more embodiments, the compound represented by Formula 1A may be a phosphorescent luminescent compound, a fluorescent luminescent compound, or a quantum dot wherein hydrogen may be substituted with a group represented by *—C≡C—H (where * indicates a binding site to a neighboring atom).

In one or more embodiments, the compound represented by Formula 1A may be, for example, PD80A, PD80A-m, PD80A-o, PD86A, PD86A-m, PD86A-o, D1-19A, D1-19A-m, D1-19A-o, FD(17)A, FD(17)A-m, or FD(17)A-o:

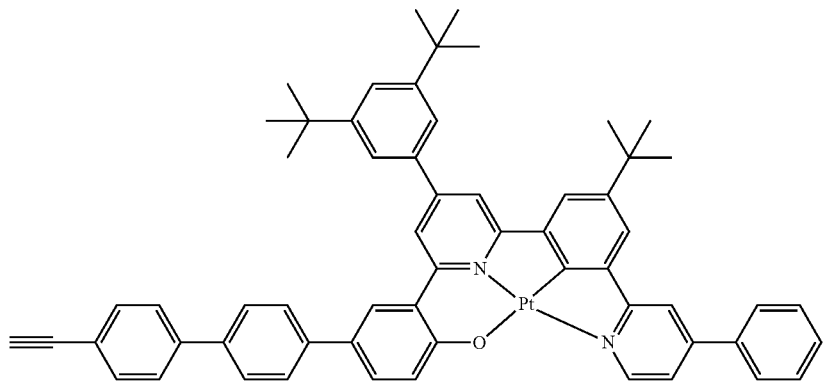

PD80A

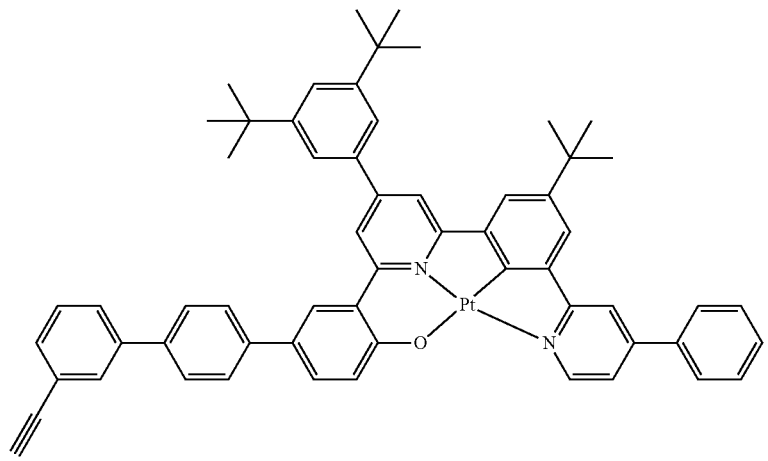

PD80A-m

-continued
PD80A-o
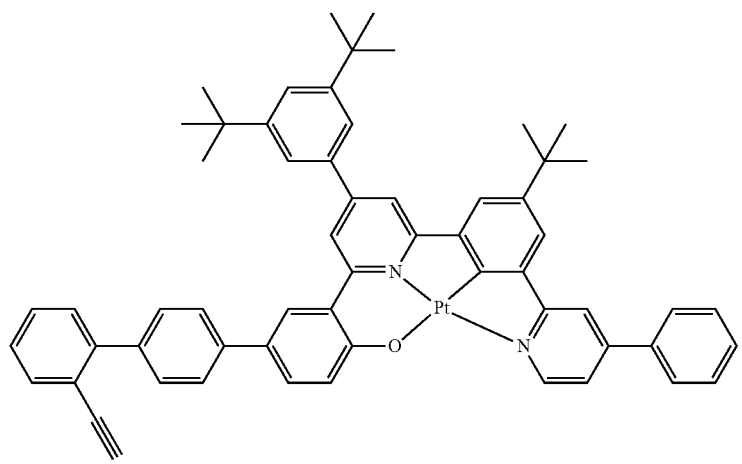
PD86A
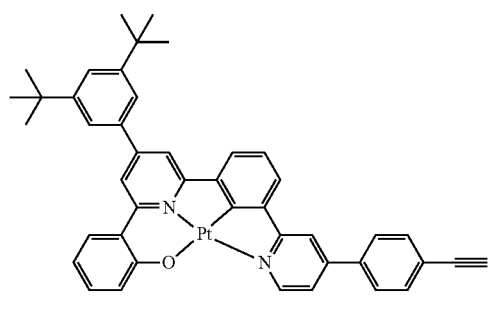
PD86A-m
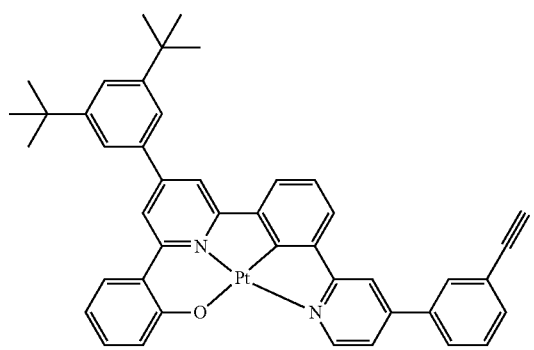
PD86A-o
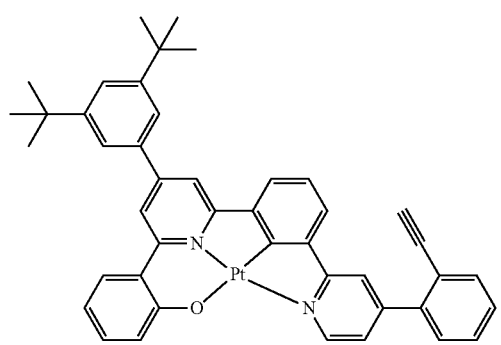
D1-19A
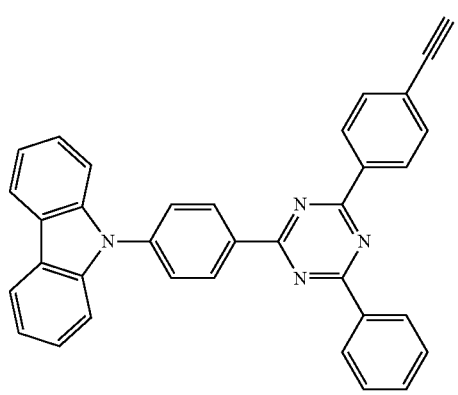
D1-19A-m
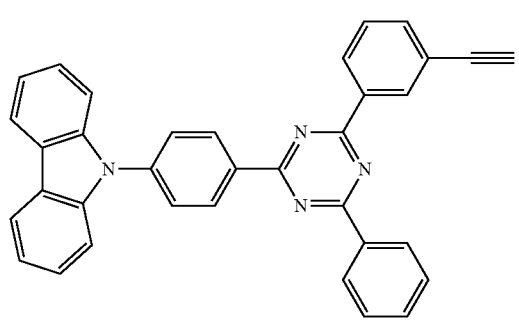
D1-19A-o
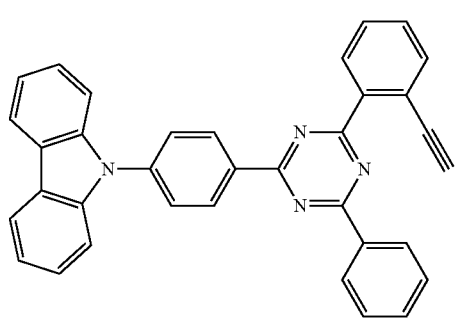

FD(17)A

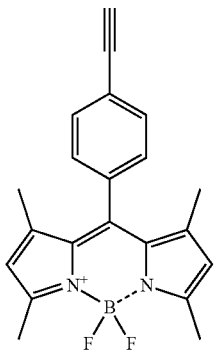

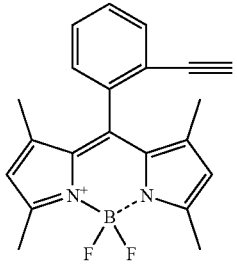

FD(17)A-m

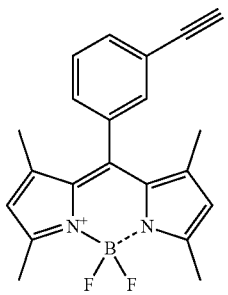

FD(17)A-o

In one or more embodiments, the chemically bonding of the light-emitting group represented by Formula 1 to the at least one carbon atom on the surface of the carbon-containing film 11 by contacting the carbon-containing film 11 and the compound represented by Formula 1A, may include immersing of the carbon-containing film 11 in the mixture including the compound represented by Formula 1A.

Meanwhile, the interlayer 15 of FIG. 2 may be formed on the carbon-containing film 11 to which the light-emitting group 13 is chemically bonded, by using various methods, for example, a vacuum deposition method, a spin coating method, a cast method, and/or a Langmuir-Blodgett (LB) method.

In the case of forming the interlayer 15 by a vacuum deposition method, the deposition conditions differ depending on a compound for forming the interlayer 15 material, the structure, and thermal characteristics of the interlayer 15, or the like. The deposition conditions may include a deposition temperature of about 100° C. to about 500° C., a vacuum degree of about $10^{-8}$ torr to about $10^{-3}$ torr, and a deposition rate of about 0.01 angstrom per second (Å/sec) to about 100 Å/sec. However, the deposition conditions are not limited thereto.

When the interlayer 15 is formed using spin coating, coating conditions may vary according to a compound for forming the interlayer 15, the structure and thermal properties of the interlayer 15, or the like. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

In one or more embodiments, in the interlayer 15 of the light-emitting device 20, a spacer is arranged between the carbon-containing film 11 and the conductive film 19 to secure a gap, and then the gap between the carbon-containing film 11 and the conductive film 19 may be filled with the insulating material, electrolyte, air, or an inert gas by capillary phenomenon. As used herein, the term "air" refers to ambient air or air from the atmosphere.

The operating method of the light-emitting devices 10 and 20 of FIGS. 1 and 2 may include controlling a voltage applied to the carbon-containing film 11 of the light-emitting devices 10 and 20. In this manner, the intensity and/or maximum emission wavelength of light emitted from light-emitting group 13 of light-emitting devices 10 and 20 may be controlled.

For example, the controlling of the voltage applied to the carbon-containing film 11 of the light-emitting devices 10 and 20 may include continuously or discontinuously changing the voltage applied to the carbon-containing film of the light-emitting device.

The term "$C_1$-$C_{60}$ alkyl group" as used herein refers to a linear or branched saturated aliphatic hydrocarbon monovalent group having 1 to 60 carbon atoms, and examples thereof are a methyl group, an ethyl group, a propyl group, an isobutyl group, a sec-butyl group, a tert-butyl group, a pentyl group, an isoamyl group, a hexyl group, and the like. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof are a methoxy group, an ethoxy group, an isopropyloxy group, or the like.

The term "$C_1$-$C_{60}$ alkylthio group" as used herein refers to a monovalent group represented by —$SA_{101}$, (wherein $A_{101'}$ is the $C_1$-$C_{60}$ alkyl group).

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof are an ethenyl group, a propenyl group, a butenyl group, and the like. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof are an ethynyl group, a propynyl group, or the like. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof are a cyclopropyl group, a cyclobutyl group, a cyclopentyl group, a cyclohexyl group, a cycloheptyl group, or the like. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si, Ge, Se, and S as a ring-forming atom and 1 to 10 carbon atoms, and examples thereof are a tetrahydrofuranyl group, a tetrahydrothiophenyl group, or the like. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof are a cyclopentenyl group, a cyclohexenyl group, a cycloheptenyl group, or the like. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, Ge, Se, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, a 2,3-dihydrothiophenyl group, or the like. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, a chrysenyl group, or the like. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a carbocyclic aromatic system that has at least one heteroatom selected from N, O, P, Si, Ge, Se, and S as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, Si, Se, Ge, and S as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, an isoquinolinyl group, or the like. When the $C_6$-$C_{60}$ heteroaryl group and the $C_6$-$C_{60}$ heteroarylene group each include two or more rings, the two or more rings may be fused to each other.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "$C_1$-$C_{60}$ heteroaryloxy group" as used herein indicates —$OA_{102'}$ (wherein $A_{102'}$ is the $C_1$-$C_{60}$ heteroaryl group), and the term "$C_1$-$C_{60}$ heteroarylthio group" as used herein indicates —$SA_{103'}$ (wherein $A_{103'}$ is the $C_1$-$C_{60}$ heteroaryl group).

The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_{60}$ aryl group.

The term "$C_2$-$C_{60}$ alkyl heteroaryl group" as used herein refers to a $C_1$-$C_{60}$ heteroaryl group substituted with at least one $C_1$-$C_{60}$ alkyl group. The term "$C_2$-$C_{60}$ heteroaryl alkyl group" as used herein refers to a $C_1$-$C_{60}$ alkyl group substituted with at least one $C_1$-$C_{60}$ heteroaryl group.

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group are a fluorenyl group and the like. The term "divalent non-aromatic condensed polycyclic group" as used herein refers to a divalent group having the same structure as the monovalent non-aromatic condensed polycyclic group described above.

The term "monovalent non-aromatic condensed heteropolycyclic group" as used herein refers to a monovalent group (for example, having 2 to 60 carbon atoms) having two or more rings condensed with each other, a heteroatom selected from N, O, P, Si, Ge, Ge, and S, other than carbon atoms, as a ring-forming atom, and no aromaticity in its entire molecular structure. Examples of the monovalent non-aromatic condensed heteropolycyclic group are a carbazolyl group, or the like. The term "divalent non-aromatic condensed heteropolycyclic group" as used herein refers to a divalent group having the same structure as the monovalent non-aromatic condensed heteropolycyclic group described above.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, Ge, Se, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group ora salt thereof, a sulfonic acid group ora salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(Q_{18})(Q_{19})$, —$P(=O)(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(Q_{28})(Q_{29})$, —$P(=O)(Q_{28})(Q_{29})$, or a combination thereof; or —$N(Q_{31})(Q_{32})$, —$Si(Q_{33})(Q_{34})(Q_{35})$, —$B(Q_{36})(Q_{37})$, —$P(Q_{38})(Q_{39})$, or —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkyl group, a substituted or unsubstituted $C_2$-$C_{69}$ alkenyl group, a substituted or unsubstituted $C_2$-$C_{69}$ alkynyl group, a substituted or unsubstituted $C_1$-$C_{69}$ alkoxy group, a substituted or unsubstituted $C_1$-$C_{69}$ alkylthio group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{69}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

Hereinafter, a light-emitting device will be described in detail through Synthesis Examples and Examples.

EXAMPLES
Synthesis Example 1 (Compound PD86A)
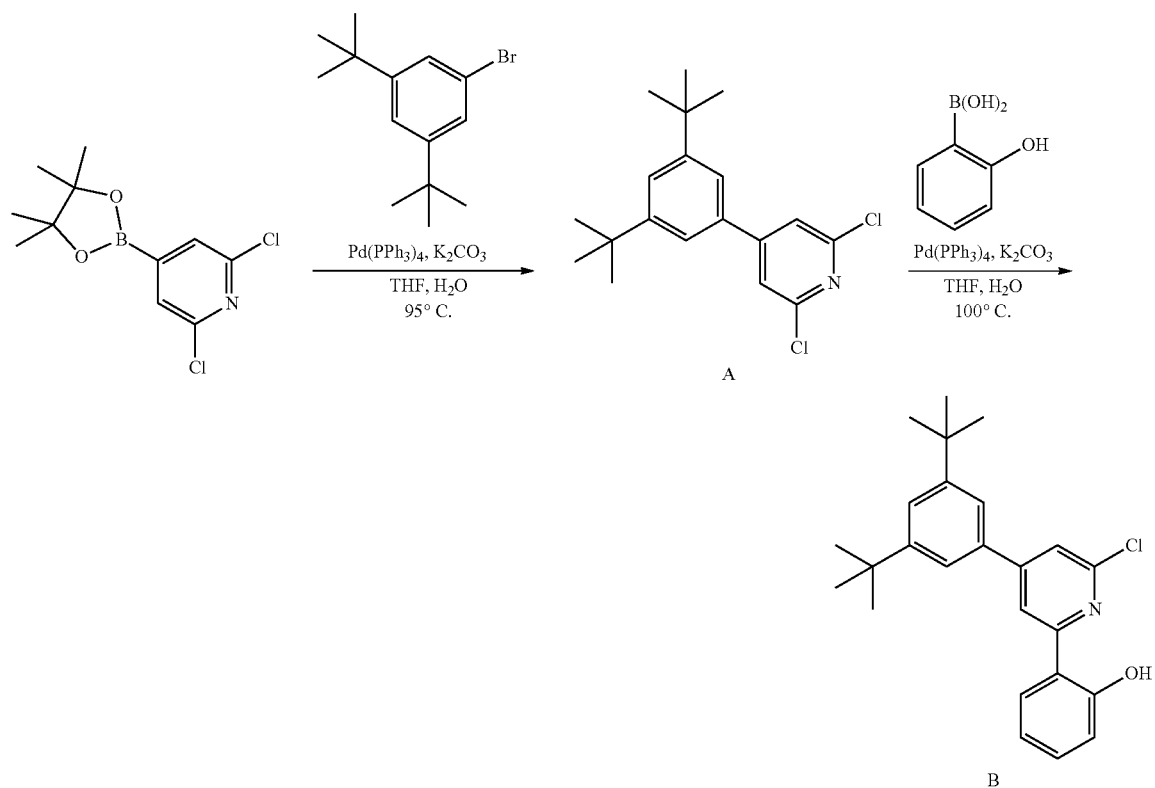
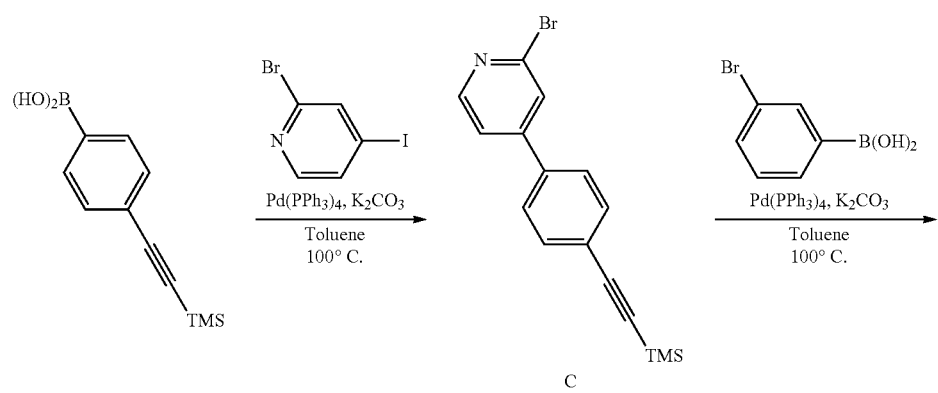

-continued
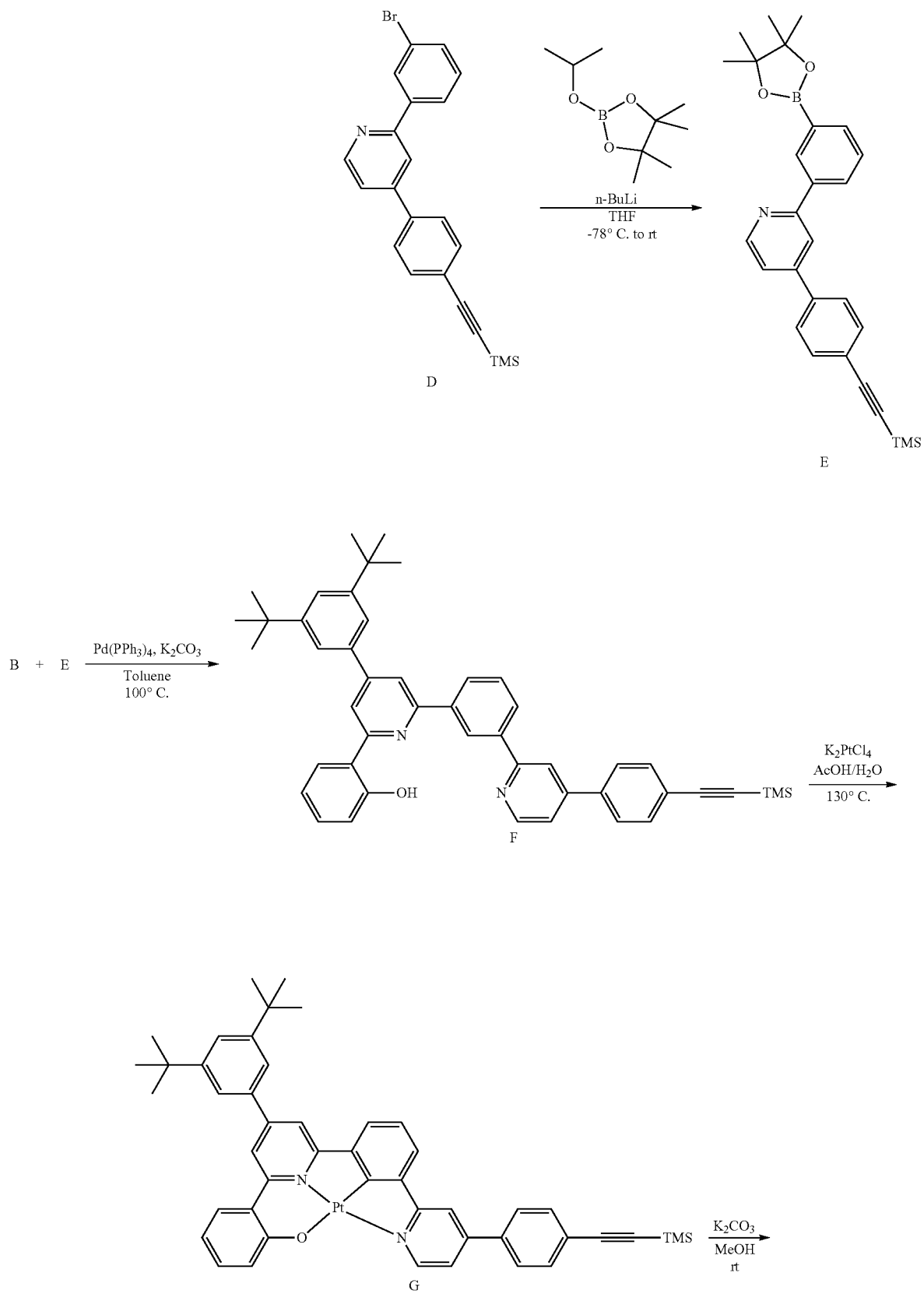

-continued

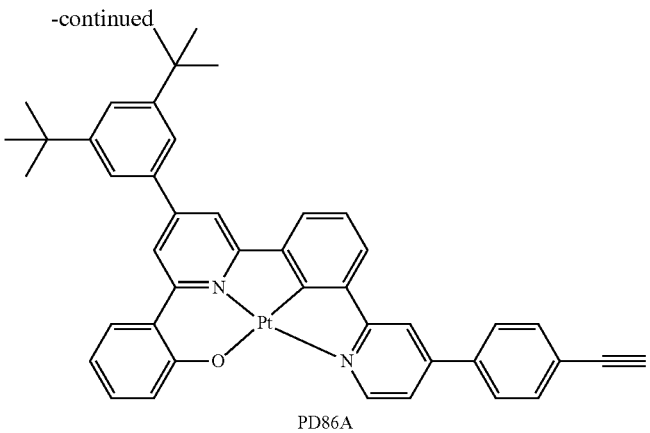

PD86A

Synthesis of Intermediate A 6.70 grams (g) (24.5 millimoles (mmol)) of 2,6-dichloro-4-(4,4,5,5-tetramethyl-1,3,2-dioxaborolan-2-yl)pyridine, 7.90 g (29.4 mmol) of 1-bromo-3,5-di-tert-butylbenzene, 1.41 g (1.22 mmol) of tetrakis(triphenylphosphine)palladium(0) (Pd(PPh$_3$)$_4$), and 10.1 g (73.4 mmol) of potassium carbonate (K$_2$CO$_3$) were added to a mixed solution including 80 milliliters (mL) of tetrahydrofuran (THF) and 40 mL of deionized (DI) water, and then stirred and heated at reflux for 24 hours. After completion of the reaction, the reaction mixture was allowed to cool to room temperature (ca. 25 C) and the aqueous layer was removed therefrom through extraction. The remaining solution was filtered under reduced pressure through a silica gel plug, and the filtrate was concentrated under reduced pressure. The product was separated by silica gel column chromatography to obtain 2.40 g (yield of 29%) of Intermediate A, which was the target compound.

Liquid chromatography-mass spectrometry (LC-MS) LC-MS (calculated: 335.12 grams per mole (g/mol), found: M+1=336 g/mol).

Synthesis of Intermediate B 2.30 g (6.84 mmol) of Intermediate A, 1.00 g (7.18 mmol) of (2-hydroxyphenyl)boronic acid, 0.553 g (0.479 mmol) of Pd(PPh$_3$)$_4$, and 3.78 g (27.4 mmol) of K$_2$CO$_3$ were added to a mixed solution including 25 mL of THF and 12 mL of DI water, and then, stirred and heated at reflux for 16 hours. After completion of the reaction, the reaction mixture was allowed to cool to room temperature, and the aqueous layer was removed therefrom through extraction. The remaining solution was filtered under reduced pressure through a silica gel plug, and the filtrate was concentrated under reduced pressure. The product was separated by silica gel column chromatography to obtain 2.10 g (yield of 78%) of Intermediate B, which was the target compound.

LC-MS (calculated: 393.19 g/mol, found: M+1=394 g/mol).

Synthesis of Intermediate C 10.0 g (45.8 mmol) of (4-((trimethylsilyl)ethynyl)phenyl)boronic acid, 13.0 g (45.8 mmol) of 2-bromo-4-iodopyridine, 5.30 g (4.58 mmol) of Pd(PPh$_3$)$_4$, and 19.0 g (138 mmol) of K$_2$CO$_3$ were added to 150 mL of toluene, and then, stirred and heated at reflux for 24 hours. After completion of the reaction, the reaction mixture was allowed to cool to room temperature, and the aqueous layer was removed therefrom through extraction. The remaining solution was filtered under reduced pressure through a silica gel plug, and the filtrate was concentrated under reduced pressure. The product was separated by silica gel column chromatography to obtain 9.84 g (yield of 65%) of Intermediate C, which was the target compound.

LC-MS (calculated: 329.02 g/mol, found: M+1=330 g/mol).

Synthesis of Intermediate D 9.00 g (27.3 mmol) of Intermediate C, 5.75 g (28.6 mmol) of (3-bromophenyl)boronic acid, 1.57 g (1.36 mmol) of Pd(PPh$_3$)$_4$, and 11.3 g (81.7 mmol) of K$_2$CO$_3$ were added to 90 mL of toluene, and then, stirred and heated at reflux for 4 hours. After completion of the reaction, the reaction mixture was allowed to cool to room temperature, and the aqueous layer was removed therefrom through extraction. The remaining solution was filtered under reduced pressure through a silica gel plug, and the filtrate was concentrated under reduced pressure. The product was separated by silica gel column chromatography to obtain 6.09 g (yield of 55%) of Intermediate D, which was the target compound.

LC-MS (calculated: 405.05 g/mol, found: M+1=406 g/mol).

Synthesis of Intermediate E 2.00 g (4.92 mmol) of Intermediate D was dissolved in 20 mL of THF under a nitrogen environment and then cooled to −78° C. while further excluding oxygen and water from the solution. 3.69 mL of n-butyl lithium (n-BuLi, 5.05 mmol, 1.6 molar (M) solution in hexanes) was slowly added thereto, and the resulting reaction mixture was then stirred for 30 minutes following the complete addition of the n-BuLi solution. 2.01 mL (9.84 mmol) of 2-isopropoxy-4,4,5,5-tetramethyl-1,3,2-dioxaborolane was slowly added thereto, and after 30 minutes, the temperature was allowed to warm to room temperature with continued stirring for 12 hours. After completion of the reaction, the organic layer was separated through extraction and concentrated under reduced pressure to obtain Intermediate E, which was the target compound. The obtained compound Intermediate E was used in the next reaction without further purification.

Synthesis of Intermediate F 1.20 g (3.05 mmol) of Intermediate B, 1.52 g (3.35 mmol) of Intermediate E, 0.246 g (0.213 mmol) of Pd(PPh$_3$)$_4$, 1.26 g (9.14 mmol) of K$_2$CO$_3$, and 0.157 g (0.914 mmol) of barium hydroxide were added to 10 mL of toluene, and then, stirred and heated at reflux for 18 hours. After completion of the reaction, the reaction mixture was allowed to cool to room temperature, and the aqueous layer was removed therefrom through extraction. The remaining solution was filtered under reduced pressure through a silica gel plug, and the filtrate was concentrated under reduced pressure. The product was separated by silica gel column chromatography to obtain 0.92 g (yield of 44%) of Intermediate F, which was the target compound.

LC-MS (calculated: 684.35 g/mol, found: M+1=685 g/mol).

Synthesis of Intermediate G 0.200 g (0.292 mmol) of Intermediate F and 0.145 g (0.350 mmol) of potassium tetrachloroplatinate(II) (K$_2$PtCl$_4$) were added to a mixed solution including 3 mL of acetic acid and 0.5 mL of DI water, and then, stirred and heated at reflux for 20 hours. After completion of the reaction, the reaction product was allowed to cool to room temperature and the solid was filtered and washed with water to obtain 0.038 g (yield of 15%) of Intermediate G, which was the target compound.

LC-MS (calculated: 877.30 g/mol, found: M+1=878 g/mol).

Synthesis of Compound PD86A 35 mg (0.0399 mmol) of Intermediate G and 16.5 mg (0.120 mmol) of K$_2$CO$_3$ were added to 1 mL of methanol to form a solution, and then, stirred at room temperature for 2 hours. After completion of the reaction, an aqueous solution of ammonium chloride (NH$_4$Cl solution) was added thereto, and the aqueous layer was removed therefrom through extraction. The remaining solution was filtered under reduced pressure through a silica gel plug, and the filtrate was concentrated under reduced pressure. The product was separated by silica gel column chromatography to obtain 23 mg (yield of 72%) of PD86A, which was the target compound.

LC-MS (calculated: 805.26 g/mol, found: M+1=806 g/mol).

Synthesis Example 2 (Compound D1-19A)

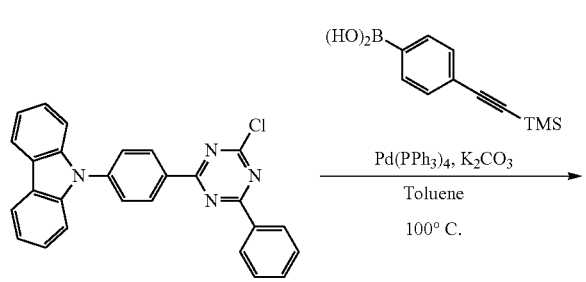

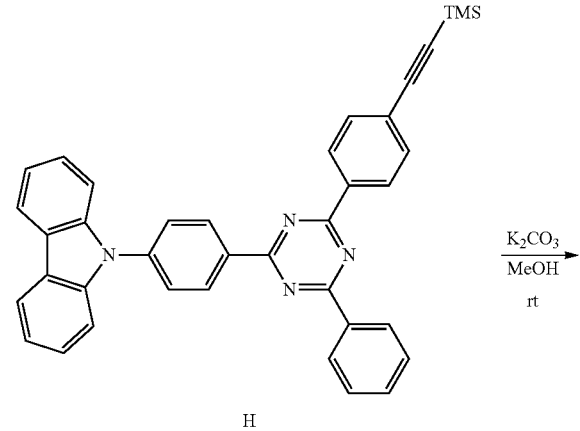

H

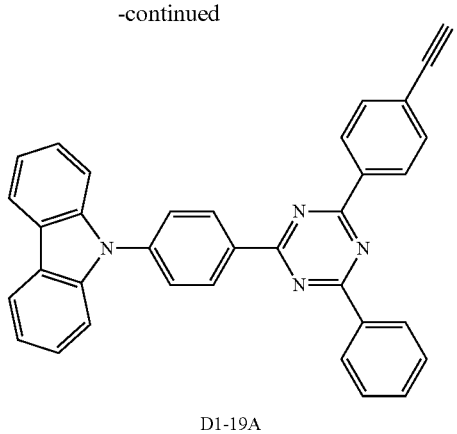

D1-19A

Synthesis of Intermediate H 5.00 g (11.6 mmol) of 9-(4-(4-chloro-6-phenyl-1,3,5-triazin-2-yl)phenyl)-9H-carbazole, 2.77 g (12.7 mmol) of (4-((trimethylsilyl)ethynyl)phenyl)boronic acid, 1.34 g (1.15 mmol) of Pd(PPh$_3$)$_4$, and 4.79 g (34.7 mmol) of K$_2$CO$_3$ were added to 40 mL of toluene, and then, stirred and heated at reflux for 18 hours. After completion of the reaction, the reaction mixture was allowed to cool to room temperature and the aqueous layer was removed therefrom through extraction. The remaining solution was filtered under reduced pressure through a silica gel plug, and the filtrate was concentrated under reduced pressure. The product was separated by silica gel column chromatography to obtain 4.48 g (yield of 68%) of Intermediate H, which was the target compound.

LC-MS (calculated: 570.22 g/mol, found: M+1=571 g/mol).

Synthesis of Compound D1-19A 2.00 g (3.50 mmol) of Intermediate H and 0.969 g (7.01 mmol) of K$_2$CO$_3$ were added to 10 mL of methanol to form a solution, and then, stirred at room temperature for 2 hours. After completion of the reaction, an aqueous NH$_4$Cl solution was added thereto, and the aqueous layer was removed therefrom through extraction. The remaining solution was filtered under reduced pressure through a silica gel plug, and the filtrate was concentrated under reduced pressure. The product was separated by silica gel column chromatography to obtain 1.43 g (yield of 82%) of D1-19A, which was the target compound.

LC-MS (calculated: 498.18 g/mol, found: M+1=499 g/mol).

Synthesis Example 3 (Compound FD(17)A)

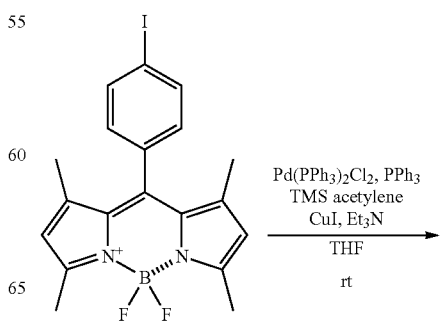

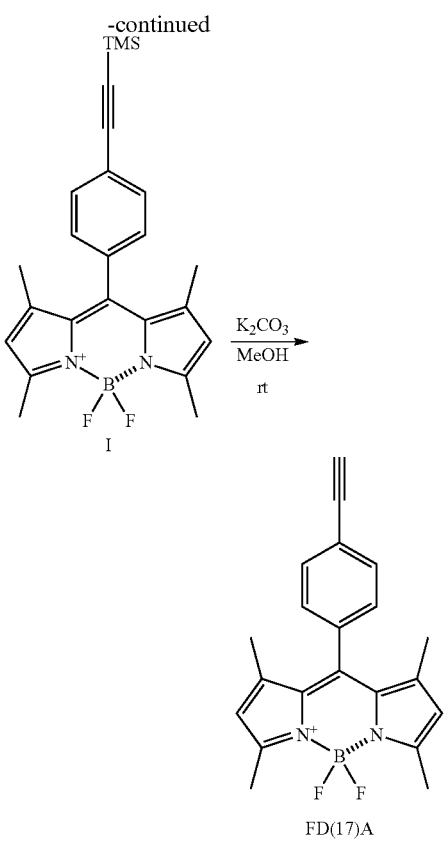

Synthesis of Intermediate I

1-[(3,5-Dimethyl-1H-pyrrol-2-yl)(3,5-dimethyl-2H-pyrrol-2-ylidene)methyl]-4-iodobenzeneydifluoroborane) 0.440 g (0.978 mmol), bis(triphenylphosphine)palladium(II) dichloride (Pd(PPh$_3$)$_2$Cl$_2$, 34 mg, 0.0489 mmol), triphenylphosphine (PPh$_3$, 7.70 mg, 0.0293 mmol), trimethylsilyl (TMS) acetylene (0.203 mL, 1.47 mmol), and triethylamine (Et$_3$N, 204 mL, 1.47 mmol) were added to 4 mL of THF, and then, stirred at room temperature for 20 minutes. Copper(I) iodide (CuI, 3.70 mg, 0.0196 mmol) was added thereto and stirred at room temperature for 14 hours. The product obtained therefrom was obtained by concentrating under reduced pressure to remove solvent, and the product solution was separated by silica gel column chromatography to obtain 0.32 g (yield of 77%) of Intermediate I, which was the target compound.

LC-MS (calculated: 420.20 g/mol, found: M+1=421 g/mol).

Synthesis of Compound FD(17)A 0.30 g (0.714 mmol) of Intermediate I and 0.197 g (1.43 mmol) of K$_2$CO$_3$ were added to 3 mL of methanol to form a solution, and then, stirred for 2 hours at room temperature. After completion of the reaction, an aqueous NH$_4$Cl solution was added thereto, and the aqueous layer was removed therefrom through extraction. The resultant solution was filtered under reduced pressure through a silica gel plug, and the filtrate was concentrated under reduced pressure. The product was separated by silica gel column chromatography to obtain 0.23 g (yield of 91%) of FD(17)A, which was the target compound.

LC-MS (calculated: 348.16 g/mol, found: M+1=349 g/mol).

Example 1

A solution of 0.25 M compound FD(17)A dissolved in THF was prepared, and 1 equivalent (eq.) of n-BuLi was added thereto and stirred. The carbon electrode was immersed in this mixed solution and left in place for 10 minutes, then was removed from the solution and washed using acetone. The resultant was immersed in a mixed solution including acetone and DI water at the ratio of 1:1 and washed by sonification, and then, washed using acetone to manufacture a light-emitting device in which a light-emitting material was attached on an electrode.

Since the light-emitting group of the light-emitting device was chemically bonded to the carbon atom on the surface of the carbon-containing film, the intensity and/or maximum emission wavelength of light emitted from the light-emitting group may be arbitrarily changed by controlling the voltage applied to the carbon-containing film without a change in the molecular structure of the light-emitting device and/or light-emitting group. Accordingly, the light-emitting device may be variously applied to various displays, light sources, monitors, or the like.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described in detail with reference to the figures, it will be understood by those of ordinary skill in the art that various changes in form and details may be made therein without departing from the spirit and scope as defined by the following claims.

What is claimed is:

1. A light-emitting device, comprising:
a carbon-containing film, wherein the carbon-containing film comprises at least one carbon atom; and
a light-emitting group represented by Formula 1,
wherein the light-emitting group is chemically bonded to the at least one carbon atom on a surface of the carbon-containing film:

$$*—(C\equiv C)\text{-}(A_1)_{m1}\text{-}(A_2)_{m2} \qquad \text{Formula 1}$$

wherein, in Formula 1,
* indicates a chemical bonding site to the at least one carbon atom on the surface of the carbon-containing film,
A$_1$ is a linking group,
A$_2$ is a group comprising a light-emitting moiety, and
m1 and m2 are each independently an integer from 1 to 10,
wherein, when m1 is 2 or greater, two or more A$_1$ are identical to or different from each other, and when m2 is 2 or greater, two or more A$_2$ are identical to each other or different from each other.

2. The light-emitting device of claim 1, wherein the carbon-containing film is flexible.

3. The light-emitting device of claim 1, wherein the carbon-containing film further comprises a carbon-containing material, wherein the carbon-containing material comprises the at least one carbon atom, and the carbon-containing material is a carbon nanotube, a carbon nanorod, a carbon fiber, a graphene sheet, a carbon nanowire, a carbon-containing particle, a graphite, a glassy carbon, a fullerene, a carbon paste, or a combination thereof.

4. The light-emitting device of claim 3, wherein the carbon-containing particle is a graphene particle, an active carbon particle, a porous carbon particle, or a combination thereof.

5. The light-emitting device of claim 1, wherein
the carbon-containing film further comprises nitrogen (N), oxygen (O), silicon (Si), boron (B), or a combination thereof, in addition to the at least one carbon atom.

6. The light-emitting device of claim 1, wherein
the surface of the carbon-containing film comprises a monolayer comprising a plurality of the groups comprising the light-emitting moiety, and
the monolayer is in direct contact with the surface of the carbon-containing film.

7. The light-emitting device of claim 6, wherein
a thickness of the monolayer is from about 0.1 nanometers to about 5.0 nanometers.

8. The light-emitting device of claim 7, wherein
the monolayer is a self-assembled monolayer.

9. The light-emitting device of claim 1, wherein
$A_1$ of Formula 1 is a single bond, a substituted or unsubstituted $C_2$-$C_{60}$ alkylene group, a substituted or unsubstituted $C_2$-$C_{60}$ alkenylene group, a substituted or unsubstituted $C_2$-$C_{60}$ alkynylene group, a substituted or unsubstituted $C_5$-$C_{30}$ carbocyclic group, or a substituted or unsubstituted $C_2$-$C_{30}$ heterocyclic group.

10. The light-emitting device of claim 1, wherein
$A_2$ in Formula 1 is a monovalent group derived from a phosphorescent luminescent compound, a fluorescent luminescent compound, or a quantum dot.

11. The light-emitting device of claim 1, wherein
$A_2$ in Formula 1 is a monovalent group derived from a transition metal-containing organometallic compound.

12. The light-emitting device of claim 1, wherein
$A_2$ of Formula 1 is a monovalent group derived from a fluorescent luminescent compound,
wherein the fluorescent luminescent compound is a prompt-fluorescence luminescent compound or a delayed-fluorescence luminescent compound.

13. The light-emitting device of claim 1, further comprising
a conductive film facing the carbon-containing film,
wherein $A_2$ of Formula 1 is oriented toward the conductive film.

14. The light-emitting device of claim 12, further comprising
an interlayer located between the carbon-containing film and the conductive film, wherein
the interlayer comprises:
a hole transport material, a light-emitting material, an electron transport material, or a combination thereof; or
an insulating material, an electrolyte, air, or inert gas.

15. The light-emitting device of claim 1, wherein
electron density of the light-emitting moiety changes based on a voltage change that is applied to the carbon-containing film.

16. The light-emitting device of claim 1, wherein
a wavelength of light emitted from the light-emitting moiety changes based on a voltage change that is applied to the carbon-containing film.

17. The light-emitting device of claim 1, wherein
a wavelength of light emitted from the light-emitting moiety continuously changes based on a continuously changing voltage that is applied to the carbon-containing film.

18. A method of manufacturing a light-emitting device, the method comprising:
providing a carbon-containing film, wherein the carbon-containing film comprises at least one carbon atom; and
contacting the carbon-containing film with a compound represented by Formula 1A and chemically bonding a light-emitting group represented by Formula 1 to the at least one carbon atom on a surface of the carbon-containing film:

$$A_4\text{-}(C\equiv C)\text{-}(A_1)_{m1}\text{-}(A_2)_{m2} \qquad \text{Formula 1A}$$

$$*\text{---}(C\equiv C)\text{-}(A_1)_{m1}\text{-}(A_2)_{m2} \qquad \text{Formula 1}$$

wherein, in Formulae 1A and 1,
$A_4$ is an organic moiety,
* indicates a chemical bonding site to the at least one carbon atom on the surface of the carbon-containing film,
$A_1$ is a linking group,
$A_2$ is a group comprising a light-emitting moiety, and
m1 and m2 are each independently an integer from 1 to 10,
wherein, when m1 is 2 or greater, two or more $A_1$ are identical to or different from each other, and when m2 is 2 or more, two or more $A_2$ are identical to each other or different from each other.

19. A method of operating a light-emitting device, the method comprising
controlling a voltage applied to the carbon-containing film of the light-emitting device of claim 1.

20. The method of claim 19, wherein
the controlling of the voltage applied to the carbon-containing film of the light-emitting device comprises continuously or discontinuously changing the voltage applied to the carbon-containing film of the light-emitting device.

* * * * *